(12) United States Patent
Tamashiro et al.

(10) Patent No.: US 7,042,546 B2
(45) Date of Patent: May 9, 2006

(54) METHOD OF MANUFACTURING DISPLAY UNIT WHEREIN SEALING MATERIAL IS EXTRUDED FROM A SEAM PORTION BETWEEN PLURALITY OF DEVICE SUBSTRATES

(75) Inventors: Hitoshi Tamashiro, Kanagawa (JP); Yuichi Iwase, Kanagawa (JP); Shoji Terada, Kanagawa (JP)

(73) Assignee: Sony Corporation, Tokyo (JP)

( * ) Notice: Subject to any disclaimer, the term of this patent is extended or adjusted under 35 U.S.C. 154(b) by 118 days.

(21) Appl. No.: 10/871,173

(22) Filed: Jun. 18, 2004

(65) Prior Publication Data

US 2005/0020175 A1    Jan. 27, 2005

(30) Foreign Application Priority Data

Jun. 23, 2003    (JP)    ............................ P2003-177887

(51) Int. Cl.
*G02F 1/1339*    (2006.01)
*G02F 1/133*    (2006.01)

(52) U.S. Cl. .......................... 349/190; 349/73; 349/153
(58) Field of Classification Search .................. 349/73, 349/153, 190
See application file for complete search history.

(56) References Cited

U.S. PATENT DOCUMENTS

| 5,106,197 | A | * | 4/1992 | Ohuchida et al. | ............. 349/73 |
| 5,661,531 | A | * | 8/1997 | Greene et al. | ................. 349/73 |
| 5,812,226 | A | * | 9/1998 | Izumi et al. | ................... 349/73 |
| 5,838,405 | A | * | 11/1998 | Izumi et al. | ................... 349/73 |
| 6,144,425 | A | | 11/2000 | Kawabata et al. | ............. 349/73 |
| 6,469,756 | B1 | * | 10/2002 | Booth, Jr. | ...................... 349/73 |
| 6,639,643 | B1 | * | 10/2003 | Babuka et al. | .............. 349/155 |
| 6,759,660 | B1 | * | 7/2004 | Izumi et al. | ........... 250/370.01 |
| 6,809,781 | B1 | * | 10/2004 | Setlur et al. | ................... 349/70 |
| 2002/0008809 | A1 | * | 1/2002 | Babuka et al. | ................. 349/73 |
| 2002/0080303 | A1 | | 6/2002 | Izumi | ........................... 349/73 |

FOREIGN PATENT DOCUMENTS

JP    2002-313569    10/2002

* cited by examiner

*Primary Examiner*—Tarifur R. Chowdhury
(74) *Attorney, Agent, or Firm*—Bell, Boyd & LLoyd LLC

(57) ABSTRACT

A method of manufacturing a display unit capable of manufacturing a large-screen display unit with high display quality without upsizing manufacturing facilities is provided. Device substrates on which a pixel including the organic light-emitting devices is formed are aligned on the same plane so as to face a sealing substrate. While the device substrates and the sealing substrate are bonded together with an adhesive resin for sealing in between, the adhesive resin for sealing is extruded from a seam portion to the backside of the seam portion so as to fill the seam portion with the adhesive resin for sealing. The backside of the seam portion can be securely sealed through a simple step. The method is suitable for a large-scale display unit using top-emitting organic light-emitting devices. A back sealing member may be disposed on the backside of the seam portion with the extruded adhesive resin for sealing in between. After that, the adhesive resin for sealing is cured.

8 Claims, 20 Drawing Sheets

METHOD OF MANUFACTURING DISPLAY UNIT WHEREIN SEALING MATERIAL IS EXTRUDED FROM A SEAM PORTION BETWEEN PLURALITY OF DEVICE SUBSTRATES

CROSS REFERENCES TO RELATED APPLICATIONS

This application claims priority to Japanese Patent Application No. P2003-177887 filed on Jun. 23, 2003, the disclosure of which is incorporated by reference herein.

BACKGROUND OF THE INVENTION

The present invention relates to a method of manufacturing a display unit including a number of small substrates which are aligned so as to upsize the display unit. More specifically, the present invention relates to a method of manufacturing a display unit suitable for manufacturing a large-scale display unit using a top-emitting organic light-emitting device.

In recent years, with the rapid advancement of computerization, a need for upsizing of display units such as televisions and monitors has been increasing. The range of uses of large-scale display units is not limited to public places such as railroad stations, airports, lobbies of buildings or hotels and conference rooms, and has been extending to ordinary households. However, the larger the scale of a conventional monitor using a CRT (Cathode Ray Tube) or a liquid crystal projector is, the more the weight or the thickness of the conventional monitor increases, so problems such as inconvenience in handling and an increase in occupied space arise.

Therefore, attention has been focused on an attempt to apply an organic light-emitting display unit using an organic light-emitting device to a large-scale display unit. In a process of manufacturing a conventional large-scale organic light-emitting display unit, for example, at first, as shown in FIG. 1, a plurality of tiles 112A, 112B, 112C and 112D are attached to a back support substrate 111 to form a large substrate 110, that is, so-called tiling is performed, and then an organic light-emitting device or the like is formed on the large substrate 110 (for example, refer to Japanese Unexamined Patent Application Publication No. 2002-313569).

However, in the conventional method, tiling is performed at first, so the number of manufacturing steps increases. Moreover, in manufacturing steps after tiling, it is required to upsize all manufacturing facilities, so manufacturing costs pronouncedly increase with renewal of facilities. Further, in terms of quality, it is difficult to uniformly form an organic layer on a large substrate, thereby it may be difficult to obtain uniform intensity across a screen.

SUMMARY OF THE INVENTION

The present invention relates to a method of manufacturing a display unit including a number of small substrates which are aligned so as to upsize the display unit. More specifically, the present invention relates to a method of manufacturing a display unit suitable for manufacturing a large-scale display unit using a top-emitting organic light-emitting device.

The present invention provides a method of manufacturing a display unit capable of manufacturing a large-screen display unit with high display quality without upsizing manufacturing facilities.

A method of manufacturing a display unit according to an embodiment of the present invention includes a sealing step in which while a plurality of device substrates each having a plurality of light-emitting devices thereon are aligned on the same plane, and the plurality of device substrates and a sealing substrate are bonded together with an adhesive resin for sealing in between, the adhesive resin for sealing is extruded from a seam portion between the plurality of device substrates to the backside of the seam portion so as to fill the seam portion with the adhesive resin for sealing; and a curing step in which the adhesive resin for sealing is cured. The method includes in an embodiment a step of disposing a back sealing member on the backside of the seam portion with the extruded adhesive resin for sealing in between the sealing step and the curing step. Moreover, the method can include in an embodiment a step of forming a shielding film on the sealing substrate before the sealing step; and an alignment step in which the sealing substrate and the plurality of device substrates are aligned so that the shielding film faces the seam portion between the plurality of device substrates between the sealing step and the curing step. Further, the method can include in an embodiment a temporary fixing step in which the plurality of device substrates and the sealing substrate are temporarily fixed by using an adhesive resin for temporary fixing between the alignment step and the curing step.

In the method of manufacturing a display unit according to an embodiment of the present invention, in the sealing step, while a plurality of device substrates are aligned on the same plane, and they are bonded to the sealing substrate with the adhesive resin for sealing in between, the adhesive resin is extruded from the seam portion between the plurality of device substrates to the backside so as to fill the seam portion with the adhesive resin for sealing. Next, in the curing step, the adhesive resin for sealing is cured.

Additional features and advantages of the present invention are described in, and will be apparent from, the following Detailed Description of the Invention and the figures.

DETAILED DESCRIPTION OF THE INVENTION

The present invention relates to a method of manufacturing a display unit including a number of small substrates which are aligned so as to upsize the display unit. More specifically, the present invention relates to a method of manufacturing a display unit suitable for manufacturing a large-scale display unit using a top-emitting organic light-emitting device.

A preferred embodiment of the present invention will be described in more detail below referring to the accompanying drawings.

Figure 1:
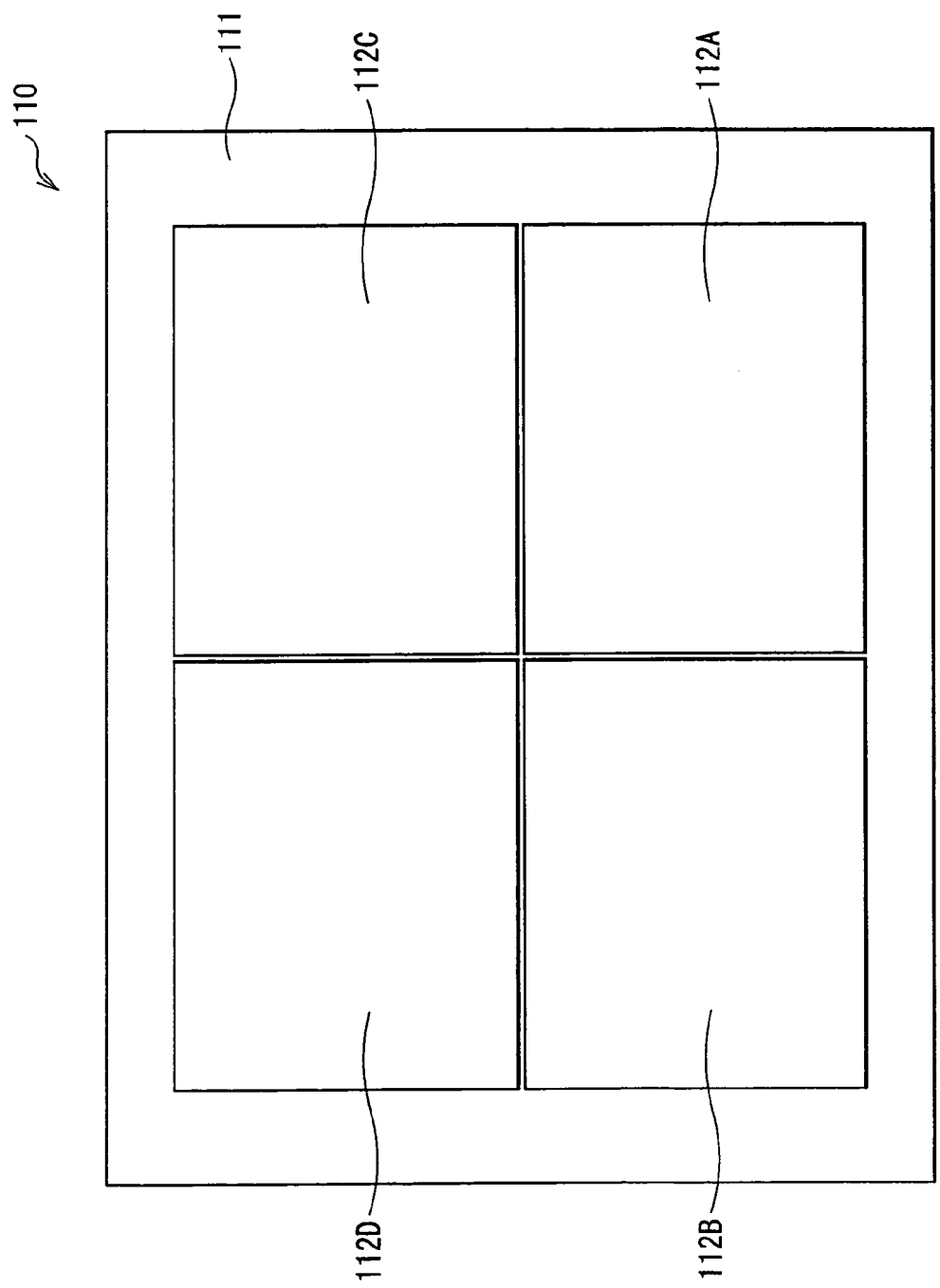
FIG. 1 is a plan view for describing a method of manufacturing a conventional large-scale organic light-emitting display unit.
Figure 2:
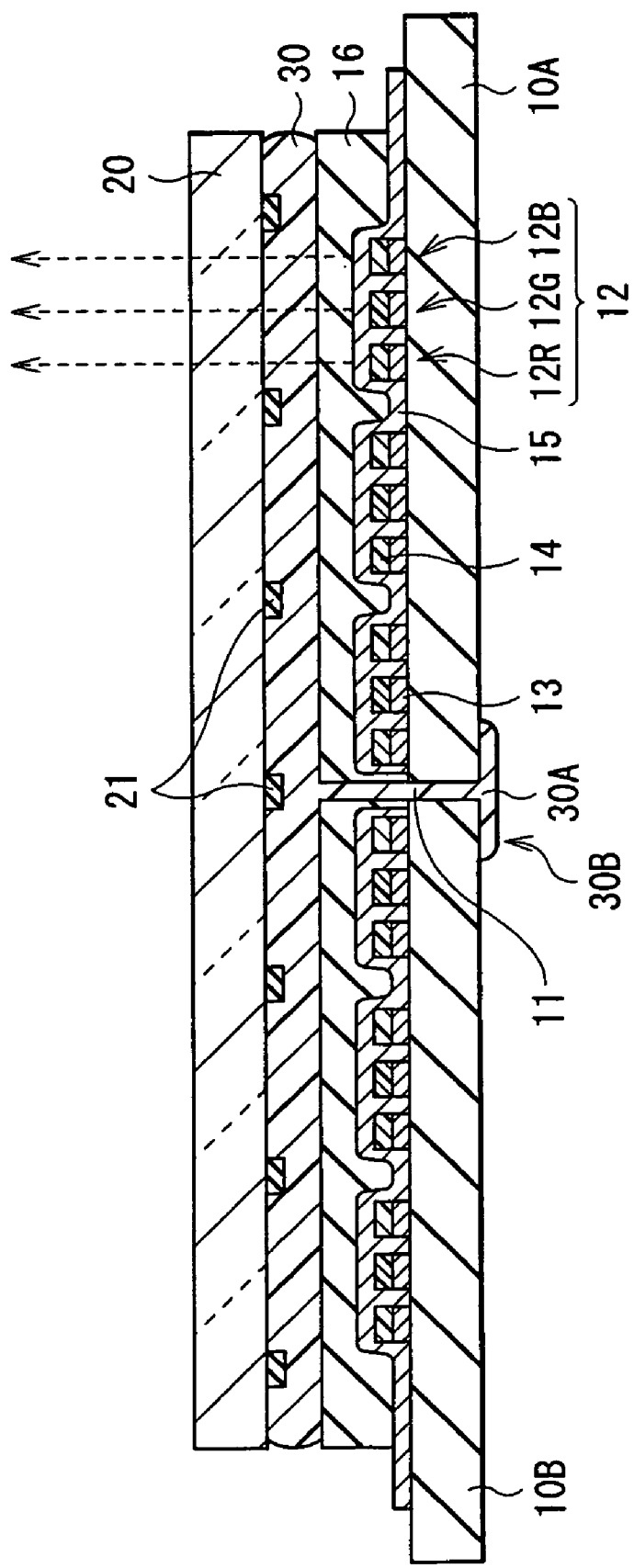
FIG. 2 is a sectional view of a display unit according to an embodiment of the invention.

FIG. 2 shows a sectional view of a display unit according to an embodiment of the invention. The display unit is used as, for example, a medium/large-scale organic light-emitting display unit such as a monitor of a personal computer or a television, or a large-scale organic light-emitting display unit such as a home theater. The display unit has a structure in which a plurality (for example, two) of device substrates 10A and 10B aligned on the same plane and a sealing substrate 20 are aligned so as to face each other, and the whole surfaces of the device substrates 10A and 10B and the sealing substrate 20 are bonded together with an adhesive layer 30.

The device substrates 10A and 10B are aligned on the same plane in a state where adjacent end surfaces of the device substrates 10A and 10B face each other with an extremely small gap, that is, a seam portion 11 in between. The seam portion 11 is filled with the adhesive layer 30. The width of the seam portion 11 will be described later.

The device substrates 10A and 10B are made of, for example, an insulating material such as glass, and on the device substrates 10A and 10B, an organic light-emitting device 12R which emits red light, an organic light-emitting device 12G which emits green light and an organic light-emitting device 12B which emits blue light are disposed in order in a matrix as a whole. Each of the organic light-emitting devices 12R, 12G and 12B corresponds to each sub-pixel, and three adjacent organic light-emitting devices 12R, 12G and 12B form a pixel 12.

In each of the organic light-emitting devices 12R, 12G and 12B, for example, a first electrode 13 as an anode, an organic layer 14 including one or more layers which includes a light-emitting layer, a second electrode 15 as a cathode are laminated in order from the device substrates 10A and 10B with a TFT and a planarizing film (both not shown) in between. If necessary, a protective film 16 made of silicon oxide ($SiO_2$), silicon nitride (SiN) or the like may be formed on the second electrode 15.

The first electrode 13 also has a function as a reflective layer, and is made of, for example, metal such as platinum (Pt), gold (Au), chromium (Cr) or tungsten (W), an alloy thereof and the like. Further, the first electrodes 13 of the organic light-emitting devices 12R, 12G and 12B are electrically separated one another by an insulating film (not shown).

The organic layer 14 has a different structure depending upon colors emitted from the organic light-emitting devices 12R, 12G and 12B. The organic layer 14 of each of the organic light-emitting devices 12R and 12B has a structure in which a hole transport layer, a light-emitting layer and an electron transport layer are laminated in this order from the first electrode 13, and the organic layer 14 of the organic light-emitting device 12G has a structure in which a hole transport layer and a light-emitting layer are laminated in this order from the first electrode 13. The hole transport layer is a layer for enhancing the efficiency of hole injection into the light-emitting layer. The light-emitting layer is a layer generating light through applying an electric field to recombine electrons and holes. The electron transport layer is a layer for enhancing the efficiency of electron injection into the light-emitting layer.

As the material of the hole transport layer in the organic light-emitting device 12R, for example, bis[(N-naphthyl)-N-phenyl]benzidine ($\alpha$-NPD) or the like can be used, and as the material of the light-emitting layer in the organic light-emitting device 12R, for example, 2,5-bis[4-[N-(4-methoxyphenyl)-N-phenylamino]]styrylbenzene-1,4-dicarbonitrile (BSB) or the like can be used, and as the material of the electron transport layer in the organic light-emitting device 12R, for example, 8-quinolinol aluminum complex ($Alq_3$) or the like can be used.

As the material of the hole transport layer in the organic light-emitting device 12B, for example, $\alpha$-NPD or the like can be used, and as the material of the light-emitting layer in the organic light-emitting device 12B, for example, 4,4'-bis(2,2'-diphenyl vinyl)biphenyl (DPVBi) is cited, and as the material of the electron transport layer in the organic light-emitting device 12B, for example, $Alq_3$ is cited.

As the material of the hole transport layer in the organic light-emitting device 12G, for example, $\alpha$-NPD is cited, and as the material of the light-emitting layer in the organic light-emitting device 12G, for example, $Alq_3$ mixed with 1% by volume of Coumarin6 (C6) is cited.

The second electrode 15 is a semi-transparent electrode, and as shown by dotted lines from the pixel 12 at the far right in FIG. 2, light emitted from the light-emitting layer is extracted from the second electrode 15. The second electrode 15 is made of, for example, metal such as silver (Ag), aluminum (Al), magnesium (Mg), calcium (Ca) or sodium (Na), or an alloy thereof or the like. A transparent electrode (not shown) made of ITO (indium tin oxide) may be further laminated on an upper surface of the second electrode 15.

The sealing substrate 20 is positioned on a side of the device substrates 10A and 10B where the organic light-emitting devices 12R, 12G and 12B are formed, and the organic light-emitting devices 12R, 12G and 12B are sealed with the sealing substrate 20 together with the adhesive layer 30. The sealing substrate 20 has as large a size as possible to cover all of the organic emitting devices 12R, 12G and 12B on the device substrates 10A and 10B, and is made of a material transparent to light generated in the organic light-emitting devices 12R, 12G and 12B such as glass.

On the sealing substrate 20, for example, a shielding film 21 as a black matrix is disposed along boundaries of pixels 12, and the shielding film 21 absorbs external light reflected by the organic light-emitting devices 12R, 12G and 12B and wiring therebetween so as to improve contrast. Further, the shielding film 21 may be disposed along not only the boundaries of pixels 12 but also boundaries of the organic light-emitting devices 12R, 12G and 12B (not shown in FIG. 2, and refer to FIG. 6). A color filter (not shown) may be disposed in a region of the sealing substrate 20 where the shielding film 21 is not disposed so as to extract light emitted from the organic light-emitting devices 12R, 12G and 12B.

Although the shielding film 21 and the color filter may be disposed on either side of the sealing substrate 20, they are preferably disposed on a side of the sealing substrate 20 closer to the device substrates 10A and 10B. It is because the shielding film 21 and the color filter are not exposed at a surface of the display unit so that they can be protected by the adhesive layer 30.

The shielding film 21 is disposed so as to face the seam portion 11 between the device substrates 10A and 10B. The shielding film 21 is made of, for example, a black resin film to which a black colorant is added and which has an optical density of 1 or over, or a thin film filter using the interference of a thin film. Between them, the shielding film 21 is preferably made of the black resin film, because the shielding film 21 can be easily formed at low cost. The thin film filter includes one or more thin films made of metal, metal nitride or metal oxide so as to attenuate light by using the interference of the thin films. More specifically, as the thin film filter, a filter in which chromium and chromium oxide (III) ($Cr_2O_3$) are alternately laminated is cited.

The adhesive layer 30 is disposed between the device substrates 10A and 10B and the sealing substrate 20 so as to secure the strength of the display unit and to more effectively prevent crystallization of the organic light-emitting devices 12R, 12G and 12B and separation of the second electrode 15 due to the entry of water or oxygen. The adhesive layer 30 is not required to be disposed all over the device substrates 10A and 10B, and the adhesive layer 30 may be disposed so as to be laid over the organic light-emitting devices 12R, 12G and 12B. It is because an end portion of the wiring is exposed to the outside of the adhesive layer 30 so as to be electrically connected to a driving circuit or the like.

As described above, the seam portion 11 is filled with the adhesive layer 30, and the adhesive layer 30 is extruded from the seam portion 11 to the backside of the device substrates 10A and 10B, and an extruded portion of the adhesive layer 30 is a plug-like portion 30A. Thereby, the backside of the seam portion 11 is sealed with the plug-like portion 30A so as to prevent the entry of water or oxygen from the backside of the seam portion 11. A surface 30B of the plug-like portion 30A is preferably planarized to reduce the thickness of the display unit.

The adhesive layer 30 is made of a thermosetting resin or an ultraviolet curable resin. Specifically, when the color filter is disposed on the sealing substrate 20, the adhesive layer 30 is preferably made of a thermosetting resin, because the material of the color filter does not easily allow ultraviolet rays to pass through.

Figure 3:
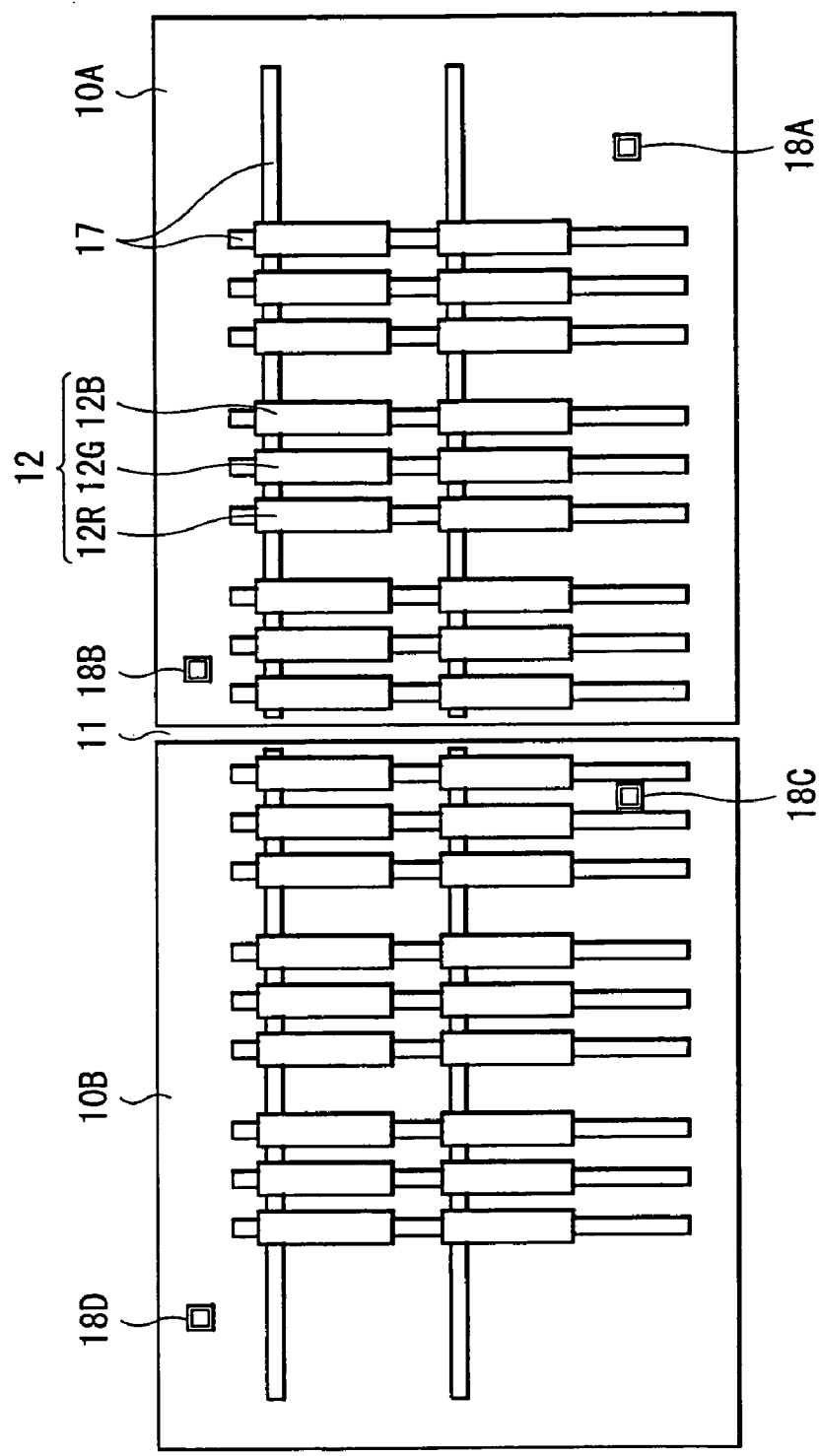
FIG. 3 is a plan view of device substrates shown in FIG. 2 viewed from a side where organic light-emitting devices are formed.

FIG. 3 shows a plan view of the device substrates 10A and 10B on a side where the organic light-emitting devices 12R, 12G and 12B are formed. On the device substrates 10A and 10B, wiring 17 made of, for example, aluminum (Al) is formed in a matrix, and on the wiring 17, a light-emitting region including the above-described organic light-emitting devices 12R, 12G and 12B is formed. In a region except for the pixels 12 of the device substrate 10A, for example, a device-side alignment marks 18A and 18B are formed in two spots along a diagonal line. In a region except for the pixels 12 of the device substrate 10B, device-side alignment marks 18C and 18D are formed in two spots along a diagonal line in a like manner.

The device-side alignment marks 18A, 18B, 18C and 18D are provided to assist a worker to perform an alignment step which will be described later while visually checking. The material of the device-side alignment marks 18A, 18B, 18C and 18D are not specifically limited, as long as the material can be identified as an alignment mark. However, a material capable of forming a film and being patterned before forming the organic light-emitting devices 12R, 12G and 12B is preferable, and, for example, the device-side alignment marks 18A, 18B, 18C and 18D are preferably made of the same material (for example, aluminum (Al)) as the wiring, because the wiring and the device-side alignment marks 18A, 18B, 18C and 18D can be formed at the same time. In the embodiment, each of the device-side alignment marks 18A, 18B, 18C and 18D is formed into a square frame shape; however, the shape is not specifically limited.

Figure 4:
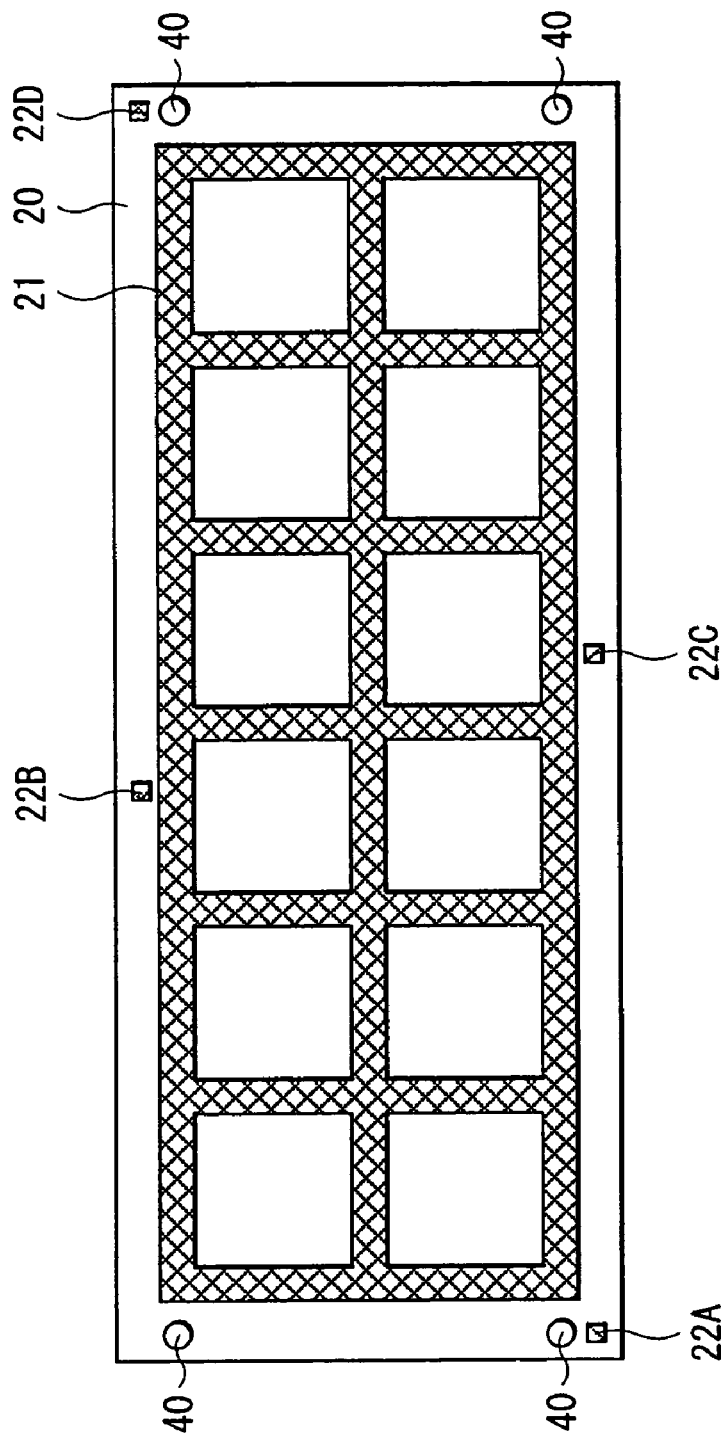
FIG. 4 is a plan view of a sealing substrate shown in FIG. 2 viewed from a side where a shielding film is formed.

FIG. 4 shows a plan view of the sealing substrate 20 on a side where the shielding film 21 is formed. On the sealing substrate 20, sealing-side alignment marks 22A, 22B, 22C and 22D are formed in positions corresponding to the device-side alignment marks 18A, 18B, 18C and 18D. The sealing-side alignment marks 22A, 22B, 22C and 22D are made of the same material as the shielding film 21, and in the embodiment, the sealing-side alignment marks 22A, 22B, 22C and 22D are formed into a square shape which can be tightly fit into a square frame; however, as long as the sealing-side alignment marks 22A, 22B, 22C and 22D have a shape corresponding to the device-side alignment marks 18A, 18B, 18C and 18D, the shape is not specifically limited. In FIG. 4, the shielding film 21 and the sealing-side alignment marks 22A, 22B, 22C and 22D are indicated with crossing diagonal lines.

A temporary fixing layer 40 is disposed on each of four corners of the sealing substrate 20. The temporary fixing layer 40 is provided to fix the sealing-side alignment marks 22A, 22B, 22C and 22D and the device-side alignment marks 18A, 18B, 18C and 18D in a precise positional relationship until a curing step is performed after an alignment step in which the sealing-side alignment marks 22A, 22B, 22C and 22D and the device-side alignment marks 18A, 18B, 18C and 18D are aligned so as to align the sealing substrate 20 and the device substrates 10A and 10B in a manufacturing process which will be described later. The temporary fixing layer 40 is preferably made of an ultraviolet curable resin, because it is easy to locally cure the ultraviolet curable resin, and the ultraviolet curable resin is cured in a short time.

Figure 5:
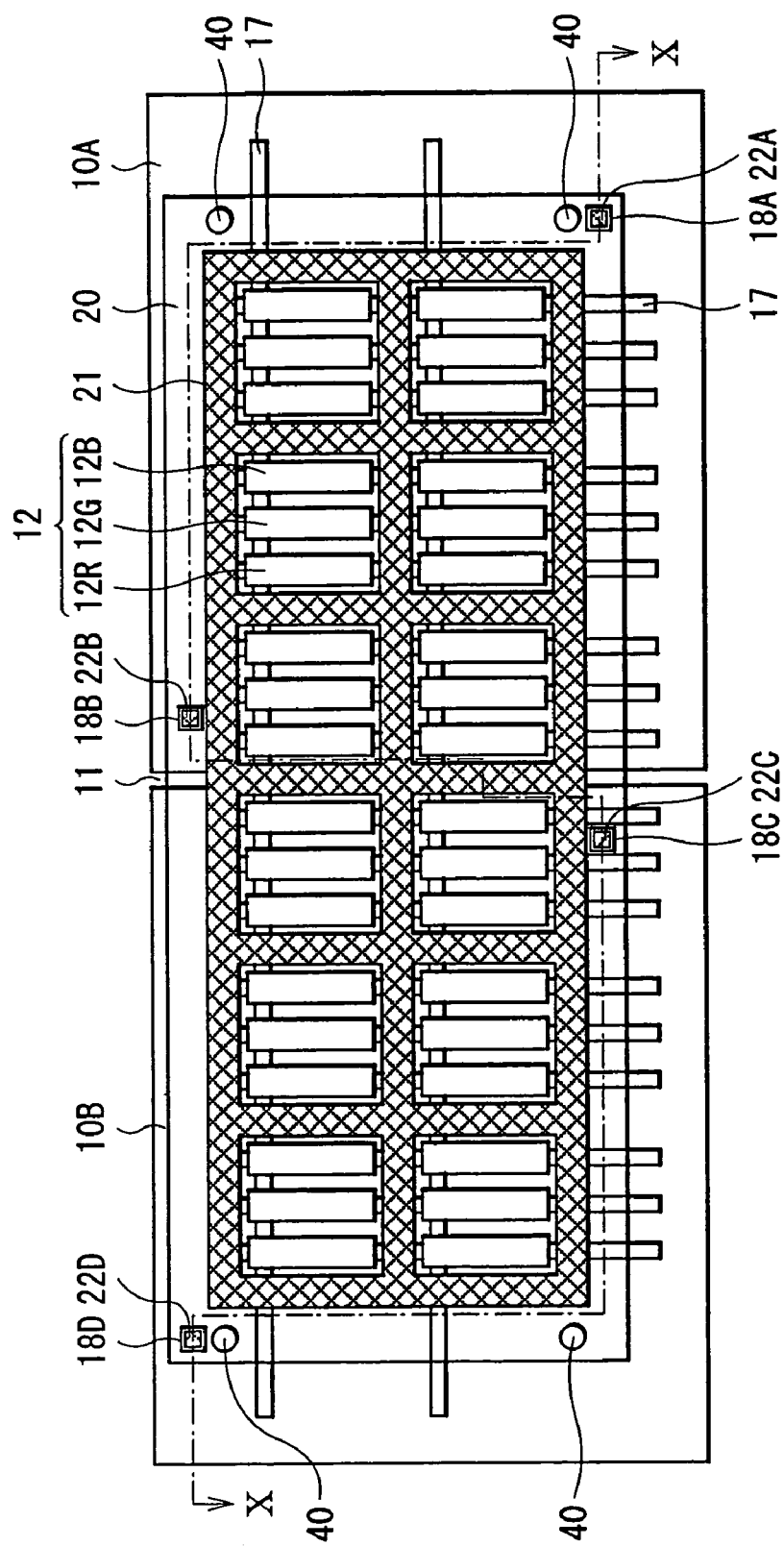
FIG. 5 is a plan view for describing a state where the device substrates shown in FIG. 3 and the sealing substrate shown in FIG. 4 overlap each other.

FIG. 5 is a plan view showing a state where the organic light-emitting devices 12R, 12G and 12B, the wiring 17 and the device-side alignment marks 18A, 18B, 18C and 18D on the device substrates 10A and 10B shown in FIG. 3 and the shielding film 21, the sealing-side alignment marks 22A, 22B, 22C and 22D and the temporary fixing layer 40 on the sealing substrate 20 shown in FIG. 4 are overlapped each other.

Figure 6:
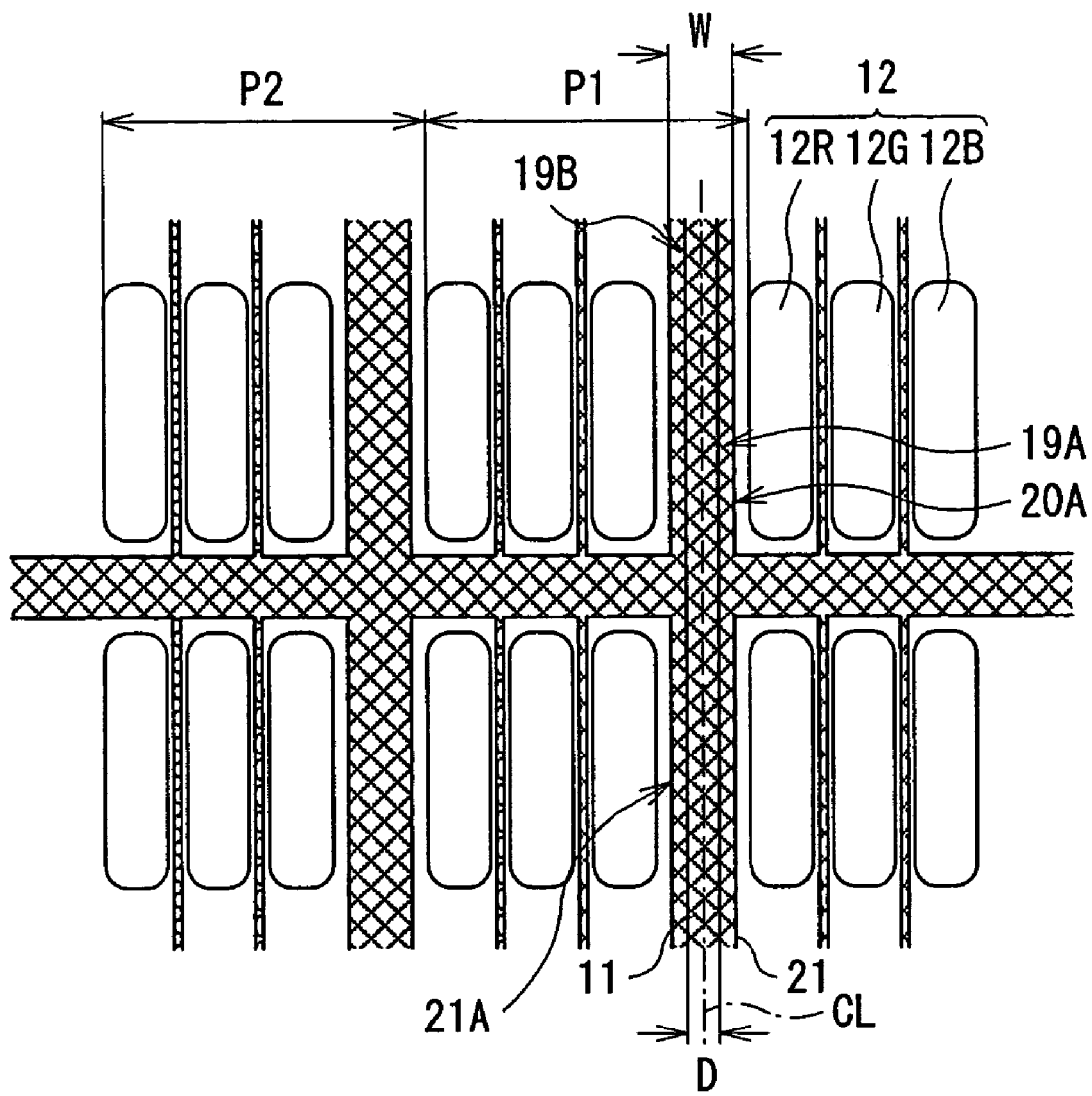
FIG. 6 is an enlarged view for describing an overlapping state around a seam portion shown in FIG. 5.

FIG. 6 is an enlarged view showing an overlapping state around the seam portion 11 in FIG. 5. It is preferable that the width D of the seam portion 11 is set depending upon the size of the pixel 12 so that a pixel pitch P1 between the pixel 12 on the device substrate 10A and the pixel 12 on the device substrate 10B which are adjacent to each other with the seam portion 11 in between is equal to a normal pixel pitch P2. Moreover, end surfaces 19A and 19B of the device substrates 10A and 10B are preferably positioned between a width-direction central line CL and a width-direction end portion 21A in the shielding film 21. Thereby, the seam portion 11 can be prevented from extending from the shielding film 21, or a shift of the center pitch of a screen due to the pixel pitch P1 which is not the same as and larger than the pixel pitch P2 can be prevented. Further, the width D of the seam portion 11 is preferably equal to or smaller than the width W of the shielding film 21.

A method of manufacturing the display unit and manufacturing apparatuses used for the method will be described below referring to FIGS. 3, 4, and 7A through 15.

Step of Forming Device-Side Alignment Marks

At first, as shown in FIG. 3, a plurality of first electrodes 13 made of the above-described material and the wiring made of the above-described material are formed on the device substrates 10A and 10B through, for example, DC sputtering. Then, the device-side alignment marks 18A, 18B, 18C and 18D are formed of the same material as the wiring.

Next, the hole transport layer, the light-emitting layer and the electron transport layer all of which are made of the above-described materials are formed on each of the first electrodes 13 by color through, for example, vapor deposition by using an area mask (not shown), thereby the organic layer 14 is formed. After forming the organic layer 14, the second electrode 15 made of the above-described material is formed through, for example, vapor deposition. Thereby, the organic light-emitting devices 12R, 12G and 12B are formed. After that, if necessary, the protective film 16 is formed on the second electrode 15.

Step of Forming Shielding Film

Next, as shown in FIG. 4, the shielding film 21 and the sealing-side alignment marks 22A, 22B, 22C and 22D all of which are made of the above-described materials are formed on the sealing substrate 20 made of the above-described material. In the case where the color filter (not shown) is formed, the color filter can be formed through a common method, after forming the shielding film 21 and the sealing-side alignment marks 22A, 22B, 22C and 22D.

Sealing Step

Figure 7A:
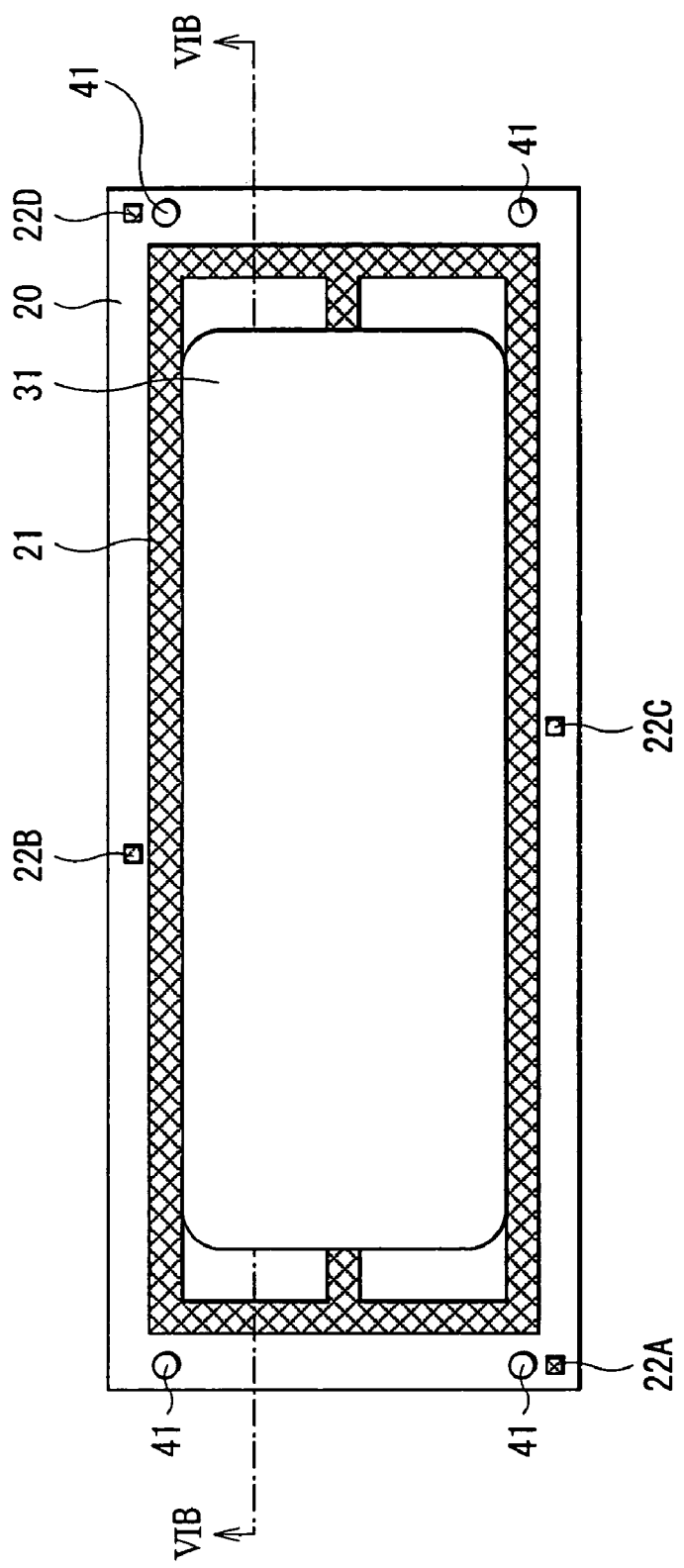
FIGS. 7A and 7B are sectional views showing steps in a method of manufacturing the display unit shown in FIG. 2.
Figure 7B:
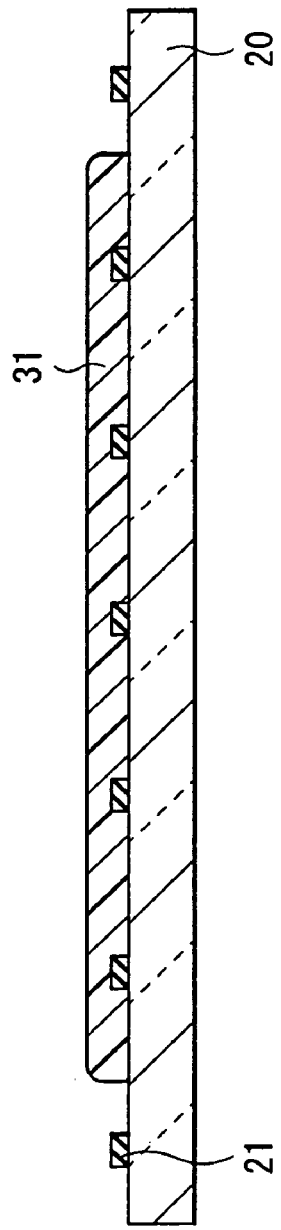

After that, as shown in FIGS. 7A and 7B, the adhesive resin for sealing 31 for forming the adhesive layer 30 on the sealing substrate 20 and an adhesive resin for temporary fixing 41 for forming a temporary fixing layer 40 are applied through coating. The coating may be performed through discharging a resin from a slit nozzle dispenser, or through roll coating or screen printing. The coating method is not specifically limited. The amounts of the adhesive resin for sealing 31 and the adhesive resin for temporary fixing 41 are preferably adjusted so that a space between the device substrates 10A and 10B and the sealing substrate 20 after they are bonded together is approximately from 2 µm to 200 µm. Moreover, it is preferable that the adhesive resin for sealing 31 and the adhesive resin for temporary fixing 41 are separately laid out and applied. In the embodiment, for example, as shown in FIGS. 7A and 7B, the adhesive resin for sealing 31 is applied in a sheet shape, and the adhesive resin for temporary fixing 41 is applied in a dot shape.

Figure 8:
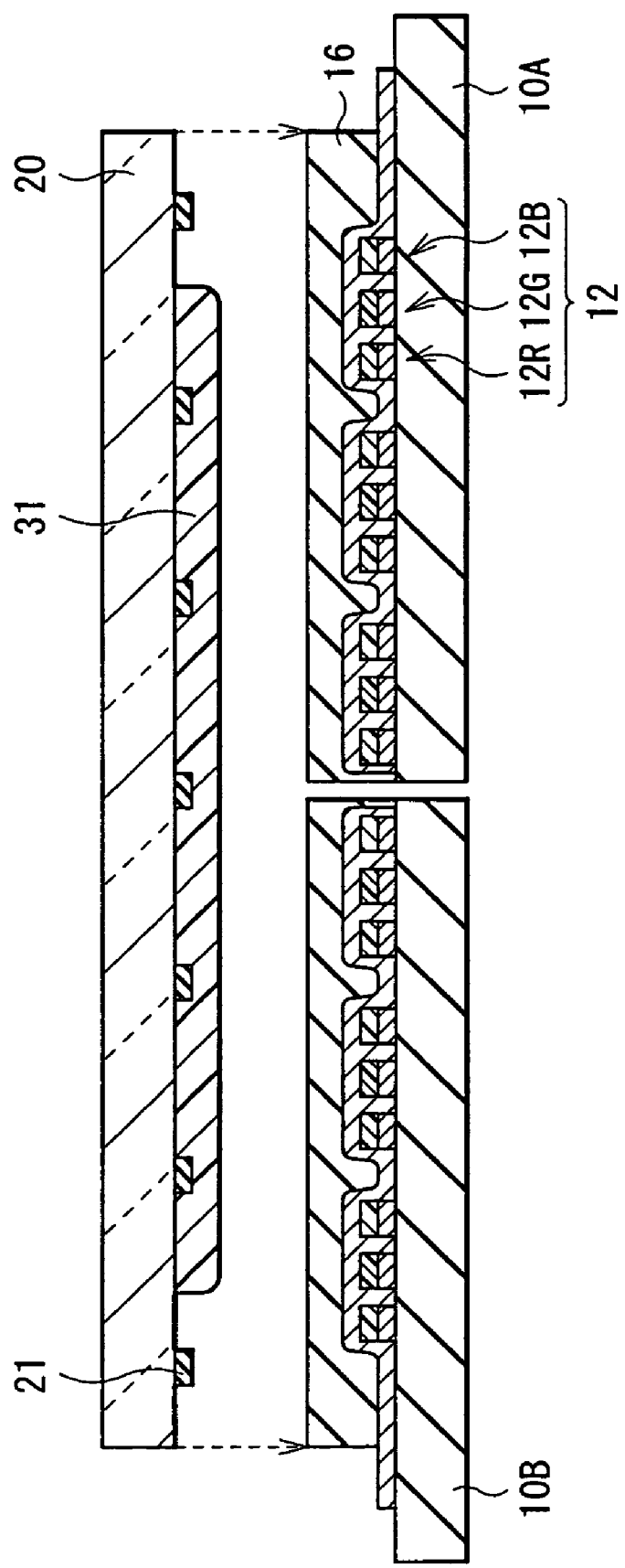
FIG. 8 is a sectional view showing a step following the steps of FIGS. 7A and 7B.
Figure 9:
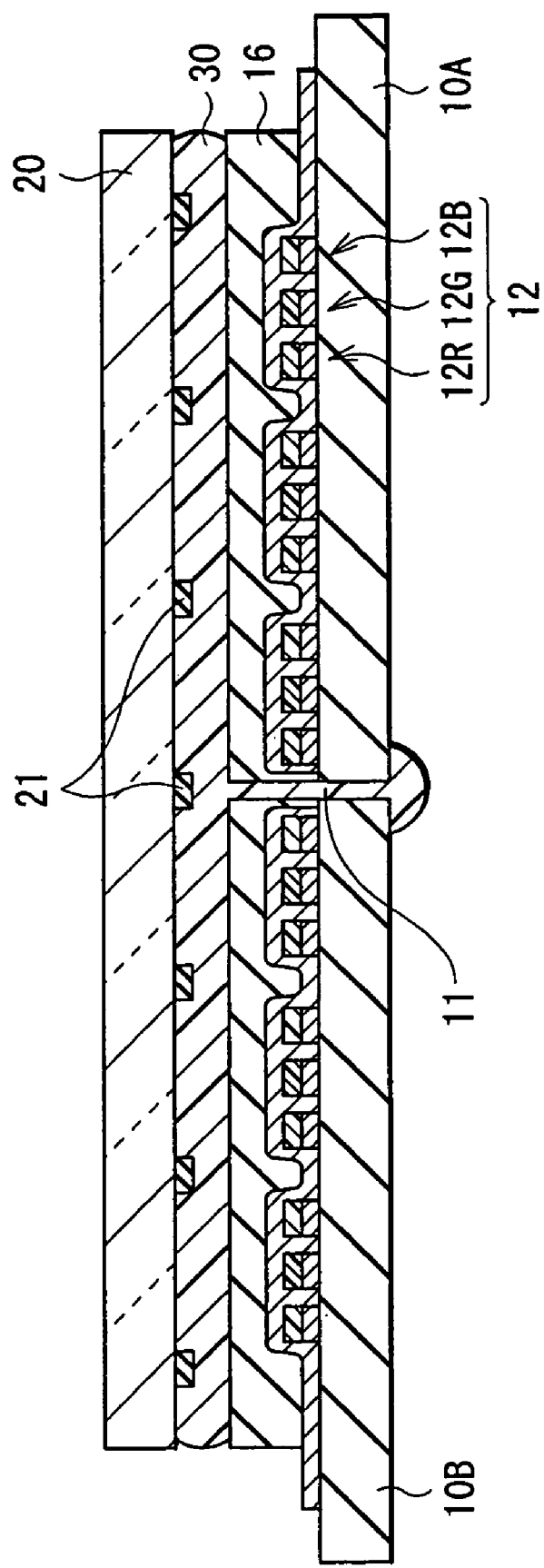
FIG. 9 is a sectional view showing a step following the step of FIG. 8.

Next, as shown in FIG. 8, the device substrates 10A and 10B are aligned on the same plane, and face the sealing substrate 20. Then, as shown in FIG. 9, while the device substrates 10A and 10B and the sealing substrate 20 are bonded together with the adhesive resin for sealing 31 in between, the adhesive resin for sealing 31 is extruded from the seam portion 11 to the backside so as to fill the seam portion 11 with the adhesive resin for sealing 31. Thereby, the backside of the seam portion 11 can be securely sealed through a simple step. Therefore, the method is suitable for a large-scale display unit using top-emitting organic light-emitting devices 12R, 12G and 12B which extract light generated in the light-emitting layer from the second electrode 15.

Figure 10:
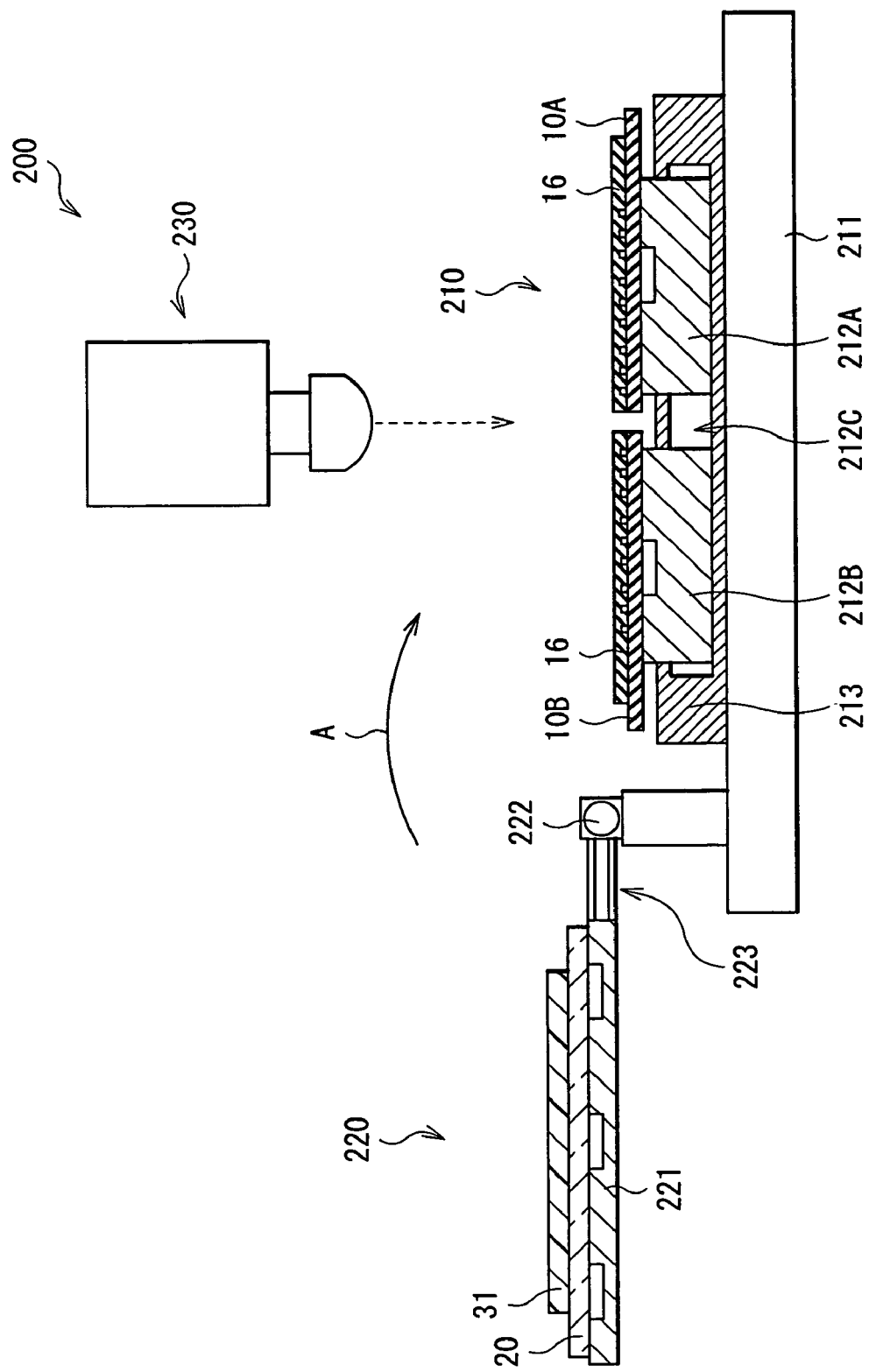
FIG. 10 is an illustration for describing an example of a manufacturing apparatus used in the step shown in FIG. 8.

FIG. 10 shows an example of a manufacturing apparatus used for bonding the device substrates 10A and 10B and sealing substrate 20 together. In a manufacturing apparatus 200, while the device substrates 10A and 10B and the sealing substrate 20 are bonded together, the seam portion 11 can be filled with the adhesive resin for sealing 31. The manufacturing apparatus 200 comprises a device substrate supporting portion 210 which supports the device substrates 10A and 10B in a state where they are aligned on the same plane, a sealing substrate supporting portion 220 which puts the sealing substrate 20 in a position facing the device substrates 10A and 10B, and a pressurizing portion 230 which pressurizes the backside of the sealing substrate 20 facing the device substrates 10A and 10B.

The device substrate supporting portion 210 includes an adsorption supporting portion 212A for fixedly supporting the drive substrate 10A, and an adsorption supporting portion 212B for fixedly supporting the device substrate 10B on a base 211. A gap 212C is disposed between the adsorption supporting portions 212A and 212B. A transfer portion 213 is disposed outside the adsorption supporting portions 212A and 212B. The transfer portion 213 is one unit which prevents the deflection of the sealing substrate 20 and the device substrates 10A and 10B bonded together, and transfers them to an alignment step subsequent to this step in a state where they are kept parallel to each other.

The sealing substrate supporting portion 220 includes an arm portion 221 which supports the sealing substrate 20 by adsorption and a turning portion 223 which turns the arm portion 221 to a direction of an arrow A (a side of the device substrate supporting portion 210) about a hinge portion 222 as a center. The turning portion 223 includes, for example, a parallel leaf spring.

In such a manufacturing apparatus 200, at first, the device substrates 10A and 10B are roughly aligned by using a dowel pin (not shown), and the device substrates 10A and 10B are fixed to the adsorption supporting portions 212A and 212B by adsorption. Moreover, the sealing substrate 20 is roughly aligned by using a dowel pin (not shown), and the sealing substrate 20 is fixed to the arm portion 221 by adsorption. Next, the arm portion 221 is turned to the direction of the arrow A (the side of the device substrate supporting portion 210) so that the sealing substrate 20 faces the device substrates 10A and 10B with a predetermined space between the sealing substrate 20 and the device substrates 10A and 10B. After that, a pressure is applied to the sealing substrate 20 by the pressurizing portion 230 to spread the adhesive resin for sealing 31 across the whole surface of the sealing substrate 20, and as shown in FIG. 9, the sealing substrate 20 and the device substrates 10A and 10B are bonded together with the adhesive resin for sealing 31 in between without the entry of air bubbles. At this time, the adsorption supporting portions 212A and 212B are separately disposed so that the gap 212C is provided between the adsorption supporting portions 212A and 212B. Therefore, the adhesive resin for sealing 31 spread by the pressurizing portion 230 is extruded from the seam portion 11 to the gap 212C on the backside, so the seam portion 11 is filled with the adhesive resin for sealing 31 without the entry of air bubbles.

Alignment Step and Temporary Fixing Step

Figure 11:
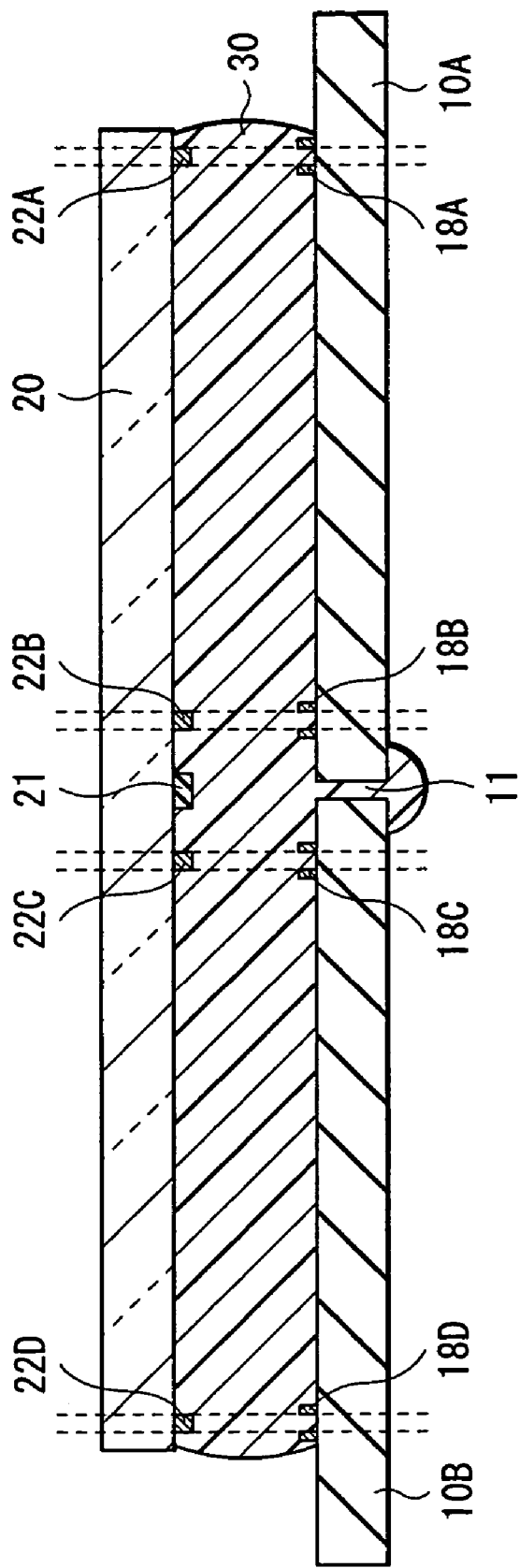
FIG. 11 is a sectional view showing a step following the step of FIG. 9.

Next, as shown in FIG. 11, an alignment step in which the sealing substrate 20 and the device substrates 10A and 10B are aligned so that the shielding film 21 faces the seam portion 11 is performed. In the alignment step, for example, the sealing-side alignment marks 22A, 22B, 22C and 22D and the device-side alignment marks 18A, 18B, 18C and 18D are aligned so that the shielding film 21 can face the seam portion 11. FIG. 11 shows a sectional view taken along a line X—X of FIG. 5.

At this time, the alignment between the sealing substrate 20 and the device substrates 10A and 10B is preferably performed, for example, through fixing the sealing substrate 20 and aligning the device substrate 10A and 10B one by one with the sealing substrate 20. In other words, the device substrate 10A is aligned with the sealing substrate 20 by the alignment between the sealing-side alignment marks 22A and 22B and the device-side alignment marks 18A and 18B, and then the device substrate 10B is aligned with the sealing substrate 20 by the alignment between the sealing-side alignment marks 22C and 22D and the device-side alignment marks 18C and 18D.

Moreover, in the case where the device substrates 10A and 10B are aligned one by one, it is required to prevent the device substrates 10A and 10B which have been already aligned from being shifted from precise positions. Therefore, it is preferable that the device substrates 10A and 10B are aligned one by one, and then the device substrate 10A and 10B which have been already aligned are temporarily fixed in order.

Figure 12:
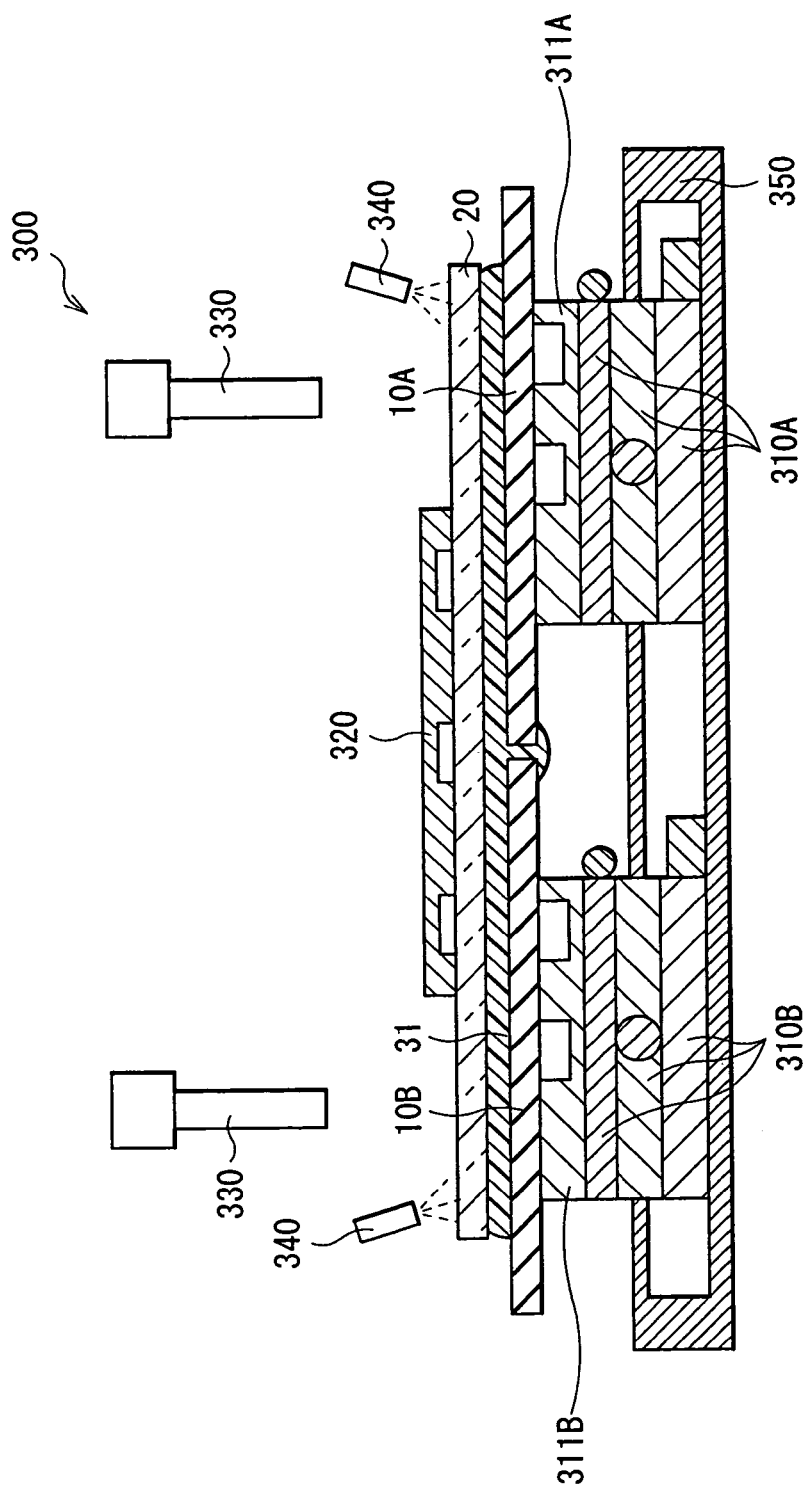
FIG. 12 is an illustration for describing an example of a manufacturing apparatus used in the step shown in FIG. 11.

FIG. 12 shows an example of a manufacturing apparatus used for such an alignment step. A manufacturing apparatus 300 comprises an XYθ alignment portion 310A for aligning the device substrate 10A, an XYθ alignment portion 310B for aligning the device substrate 10B and a sealing substrate fixing portion 320 which fixes the sealing substrate 20. Moreover, the manufacturing apparatus 300 further includes an alignment mark observation portion 330 for a worker to visually check the device-side alignment marks 18A, 18B, 18C and 18D and the sealing-side alignment marks 22A, 22B, 22C and 22D (refer to FIG. 11), and a curing portion for temporary fixing 340 for curing the adhesive resin for temporary fixing 41 to form the temporary fixing layer 40. As the curing portion for temporary fixing 340, for example, an UV (ultraviolet radiation) spot irradiation apparatus can be used in the case where an ultraviolet curing resin is used as the adhesive resin for temporary fixing 41. Moreover, a transfer portion 350 which is the same as that in the manufacturing apparatus 200 is disposed on both sides of the XYθ alignment portions 310A and 310B.

The XYθ alignment portion 310A includes a device substrate fixing portion 311A which fixes the device substrate 10A by vacuum adsorption. The XYθ alignment portion 310B includes a device substrate fixing portion 311B which fixes the device substrate 10B by vacuum adsorption.

In such a manufacturing apparatus 300, for example, at first, the sealing substrate 20 is fixed by the sealing substrate fixing portion 320. Moreover, the device substrate 10A is fixed to the device substrate fixing portion 311A by adsorption, and the device substrate 10B is fixed to the device substrate fixing portion 311B by adsorption.

Next, while the device-side alignment marks 18A and 18B and the sealing-side alignment marks 22A and 22B are visually checked with the alignment mark observation portion 330 of the manufacturing apparatus 300, the position of the device substrate 10A is adjusted by the XYθ alignment portion 310A so that the device-side alignment marks 18A and 18B are aligned with the sealing-side alignment marks 22A and 22B, thereby the device substrate 10A is aligned with the sealing substrate 20.

After the alignment of the device substrate 10A is completed, a temporary fixing step in which the adhesive resin for temporary fixing 41 is cured by the curing portion for temporary fixing 340 to form the temporary fixing layer 40 is performed. Thereby, the device substrate 10A can be prevented from being shifted from a precise position after the alignment.

Next, as in the case of the device substrate 10A, the device substrate 10B is aligned with the sealing substrate 20.

After the alignment of the device substrate 10B is completed, the temporary fixing step in which the adhesive resin for temporary fixing 41 is cured by the curing portion for temporary fixing 340 in a like manner to form the temporary fixing layer 40 is performed. Thereby, the device substrate 10B can be prevented from being shifted from a precise position after the alignment.

Step of Disposing Back Sealing Member

Figure 13:
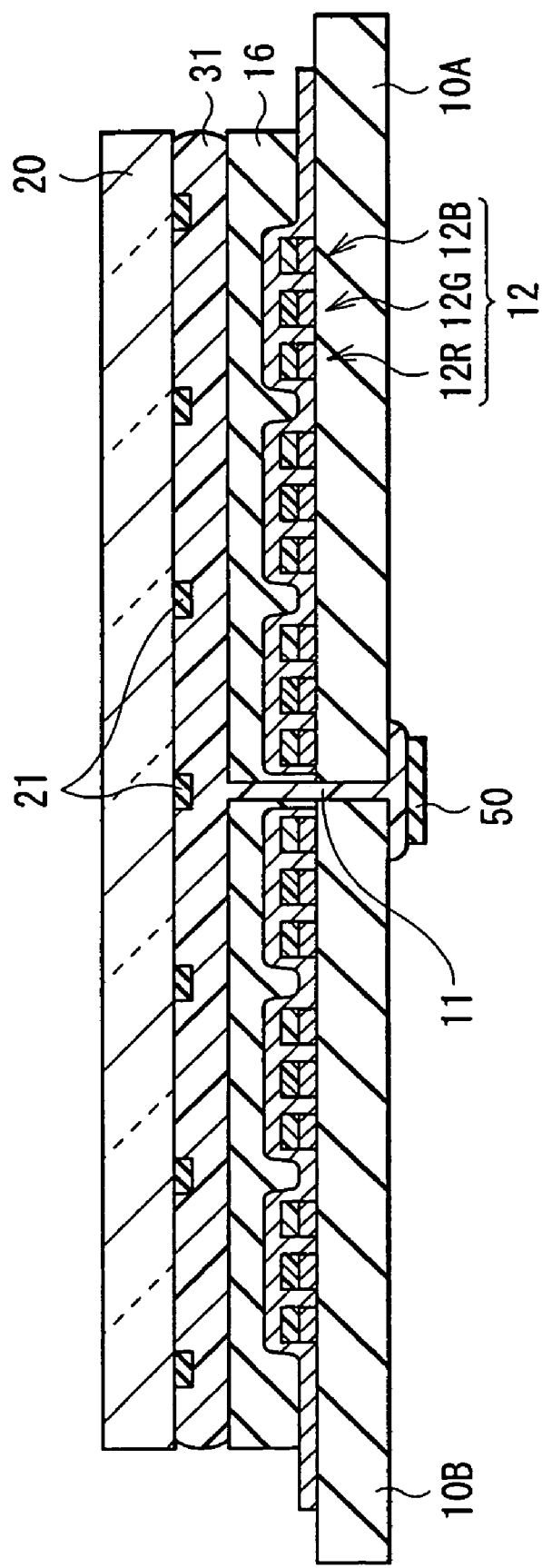
FIG. 13 is a sectional view showing a step following the step of FIG. 11.
Figure 14:
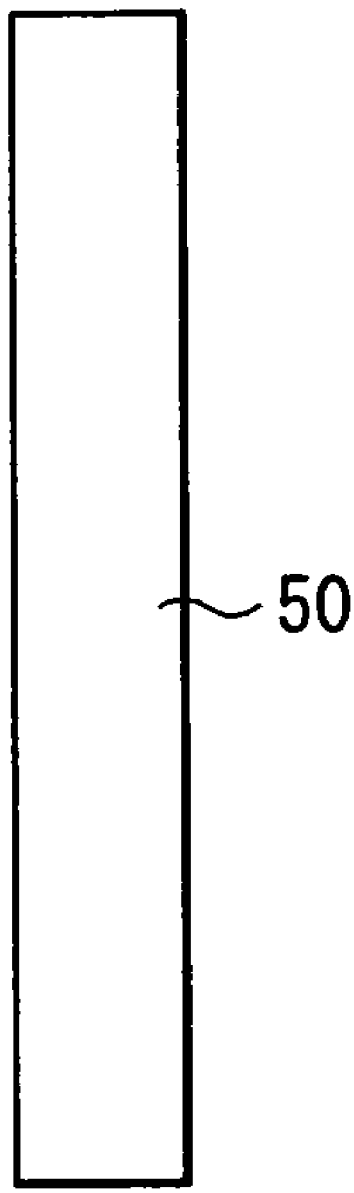
FIG. 14 is a plan view of a back sealing member used in the step shown in FIG. 13.

Next, as shown in FIG. 13, a back sealing member 50 is disposed on the backside of the seam portion 11 with the extruded adhesive resin for sealing 31 in between. The back sealing member 50 is formed according to the shape of the seam portion 11, and in the embodiment, the back sealing member 50 is formed into a rectangular shape shown in FIG. 14. The width of the back sealing member 50 is preferably larger than the width of the seam portion 11.

The back sealing member 50 can be made of, for example, metal, glass, silicone rubber or a mold release paper. The back sealing member 50 is preferably made of metal or glass, because the back sealing member 50 can be remained without removing after curing the adhesive resin for sealing 31 so that the backside of the seam portion 11 can be sealed, thereby the entry of water, air or the like can be securely prevented, and reliability can be improved. The back sealing member 50 is preferably made of silicone rubber or the mold release paper, because after the adhesive resin for sealing 31 is cured in a curing step which will be described later to form the adhesive layer 30, the back sealing member 50 can be removed as shown in FIG. 2 so that the surface 30B of the plug-like portion 30A of the adhesive layer 30 can be planarized. The back sealing member 50 may be made of a flexible material such as a tape or a firm material such as a plate.

Figure 15:
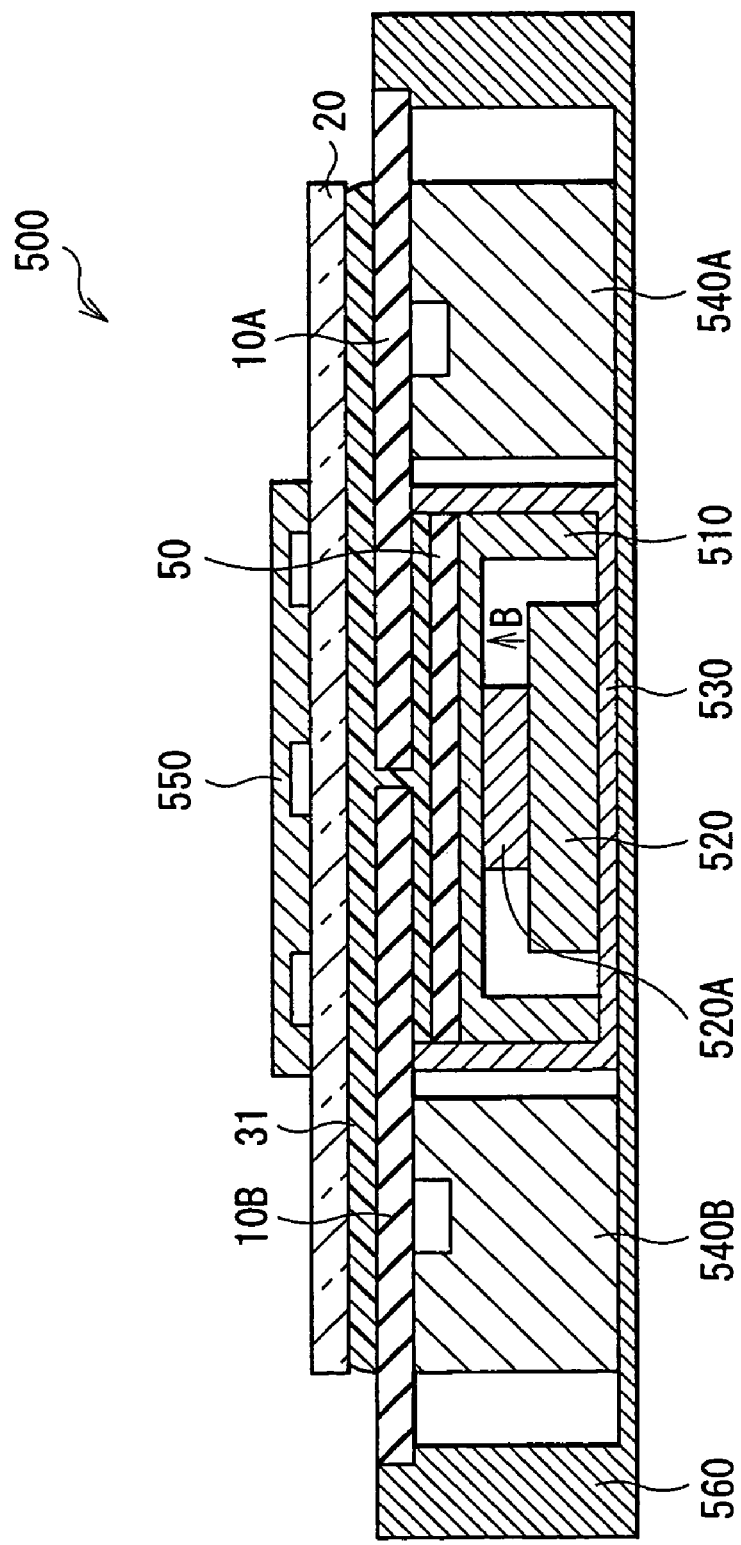
FIG. 15 is an illustration for describing an example of a manufacturing apparatus used in the step shown in FIG. 13.

FIG. 15 shows an example of a manufacturing apparatus used for disposing the back sealing member 50. A manufacturing apparatus 500 pushes the back sealing member 50 to the device substrates 10A and 10B so as to reduce a gap between the sealing member 50 and the device substrates 10A and 10B as much as possible, thereby a sealing effect by the plug-like portion 30A shown in FIG. 2 is further enhanced. The manufacturing apparatus 500 comprises a pressurizing plate 510 which applies pressure to the back sealing member 50 in a direction of an arrow B (a side of the device substrates 10A and 10B), and a pushing member 520 which pushes the pressurizing plate 510 up to the direction of the arrow B (the side of the device substrates 10A and 10B). It is preferable that the pressurizing plate 510 can uniformly apply pressure to the whole surface of the back sealing member 50, and the pressurizing plate 510 is preferably formed according to the shape of the back sealing member 50. It is preferable that the pushing member 520 can uniformly push the whole pressurizing plate 50, and in the embodiment, as the pushing member 520, a pneumatic cylinder is used. The pushing member 520 is preferably disposed according to the shape of the pressurizing plate 510. The pressurizing plate 510 and the pushing member 520 are contained in a case 530 of which the top is opened.

Moreover, the manufacturing apparatus 500 comprises a device substrate supporting portions 540A and 540B which support the device substrates 10A and 10B, respectively, and a sealing substrate fixing portion 550 which presses the sealing substrate 20 down for fixing. A transfer portion 560 which is the same as that in the manufacturing apparatus 200 is disposed on both sides of the device substrate supporting portions 540A and 540B.

In the manufacturing apparatus 500, a rod 520A of the pushing member 520 including the pneumatic cylinder is lifted up so as to push the pressurizing plate 510 and the back sealing member 50 up to the direction of the arrow B (the side of the device substrates 10A and 10B) in the case 530.

Curing Step

After that, the sealing substrate 20 and the device substrates 10A and 10B are transferred to a curing apparatus (not shown) to cure the adhesive resin for sealing 31, thereby the adhesive layer 30 is formed. After that, the back sealing member 50 is removed so as to planarize the surface 30B of the plug-like portion 30A. As described above, depending upon the material of the back sealing member 50, the back sealing member 50 may be remained without removing it. Thus, the display unit shown in FIG. 2 is completed.

In the display unit, for example, a predetermined voltage is applied between the first electrode 13 and the second electrode 15, a current is injected into the light-emitting layer of the organic layer 14, and holes and electrons are recombined to emit light mainly from an interface of the light-emitting layer on a side closer to the hole transport layer. The light passes through the second electrode 15 to be extracted. In the embodiment, the adhesive layer 30 is extruded from the seam portion 11 to the backside, and an extruded portion of the adhesive layer 30 is the plug-like portion 30A, so the entry of water or oxygen from the backside of the seam portion 11 can be prevented. Moreover, the sealing substrate 20 and the device substrates 10A and 10B are aligned so that the shielding film 21 faces the seam portion 11, so the seam portion 11 becomes inconspicuous by the shielding film 21, thereby the seam portion 11 has no influence on display quality.

Thus, in the embodiment, while the device substrates 10A and 10B are aligned on the same plane, and are bonded to the sealing substrate 20 with the adhesive resin for sealing 31 in between, the adhesive resin for sealing 31 is extruded from the seam portion 11 to the backside so as to fill the seam portion 11 with the adhesive resin for sealing 31, so the backside of the seam portion 11 can be securely sealed through a simple step. Therefore, the method is suitable for a large-scale display unit using the top-emitting organic light-emitting devices 12R, 12G and 12B which extract light generated in the light-emitting layer from the second electrode 15.

Moreover, the organic light-emitting devices 12R, 12G and 12B are formed on the device substrates 10A and 10B before the device substrates 10A and 10B are bonded to the sealing substrate 20, so unlike a conventional method, it is not required to upsize manufacturing facilities corresponding to a large-scale substrate, and existing facilities for small-scale substrates can be used as is. Further, the areas of the device substrates 10A and 10B are small, and the organic light-emitting devices 12R, 12G and 12B can be uniformly formed, so variations in quality in the case where the device substrates 10A and 10B are aligned so as to upsize the display unit can be reduced. Therefore, a large-scale display unit with high display quality can be achieved at low cost.

Modification

Next, referring to FIG. 16, a display unit according to a modification of the invention will be described below. The display unit is the same as the display unit described in the above embodiment, except that the display unit comprises four device substrates 10A, 10B, 10C and 10D. Therefore, like components are denoted by like numerals as of the embodiment and will not be further described.

Figure 16:
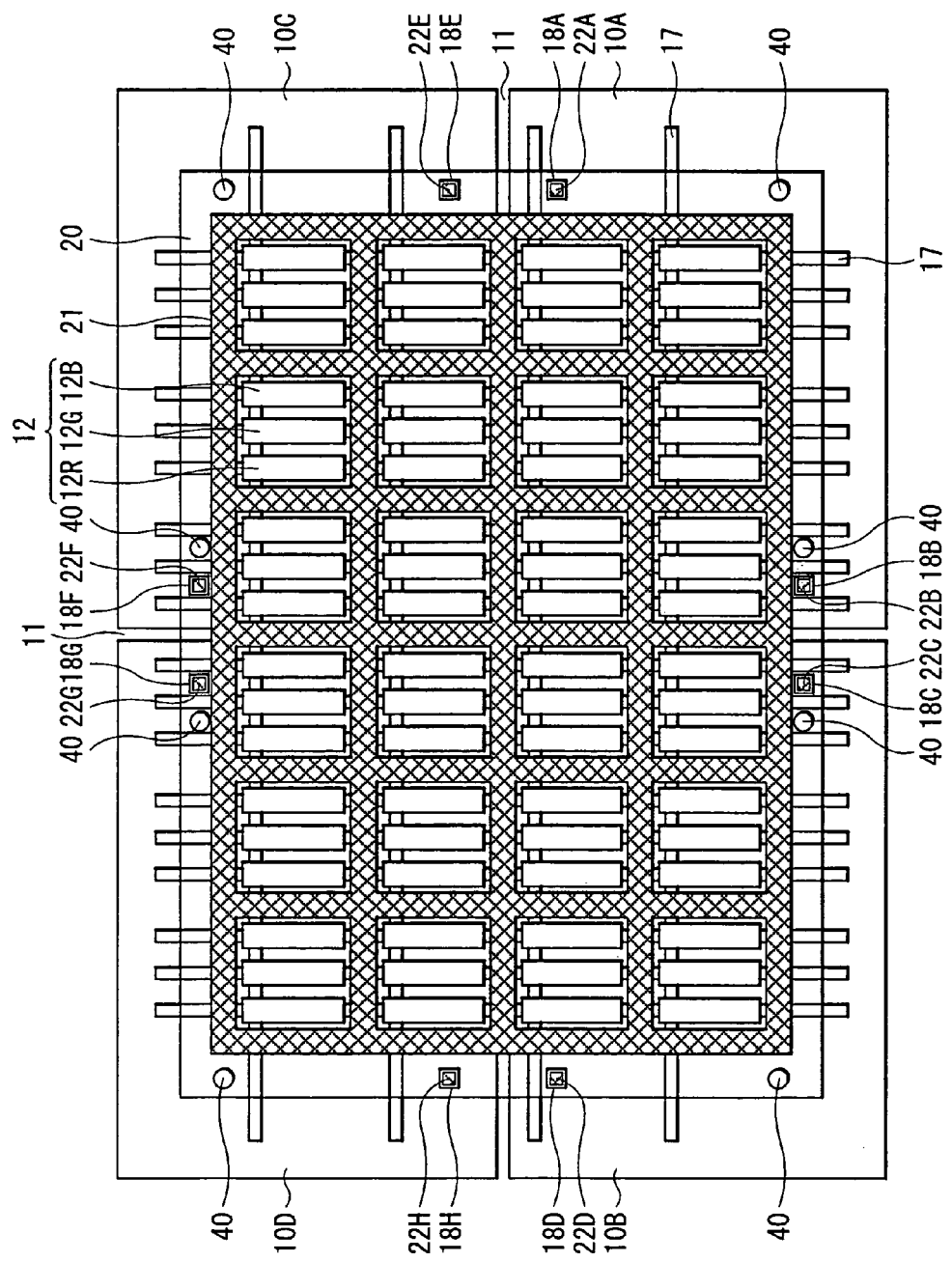
FIG. 16 is a plan view of a display unit according to another embodiment of the invention.
Figure 17:
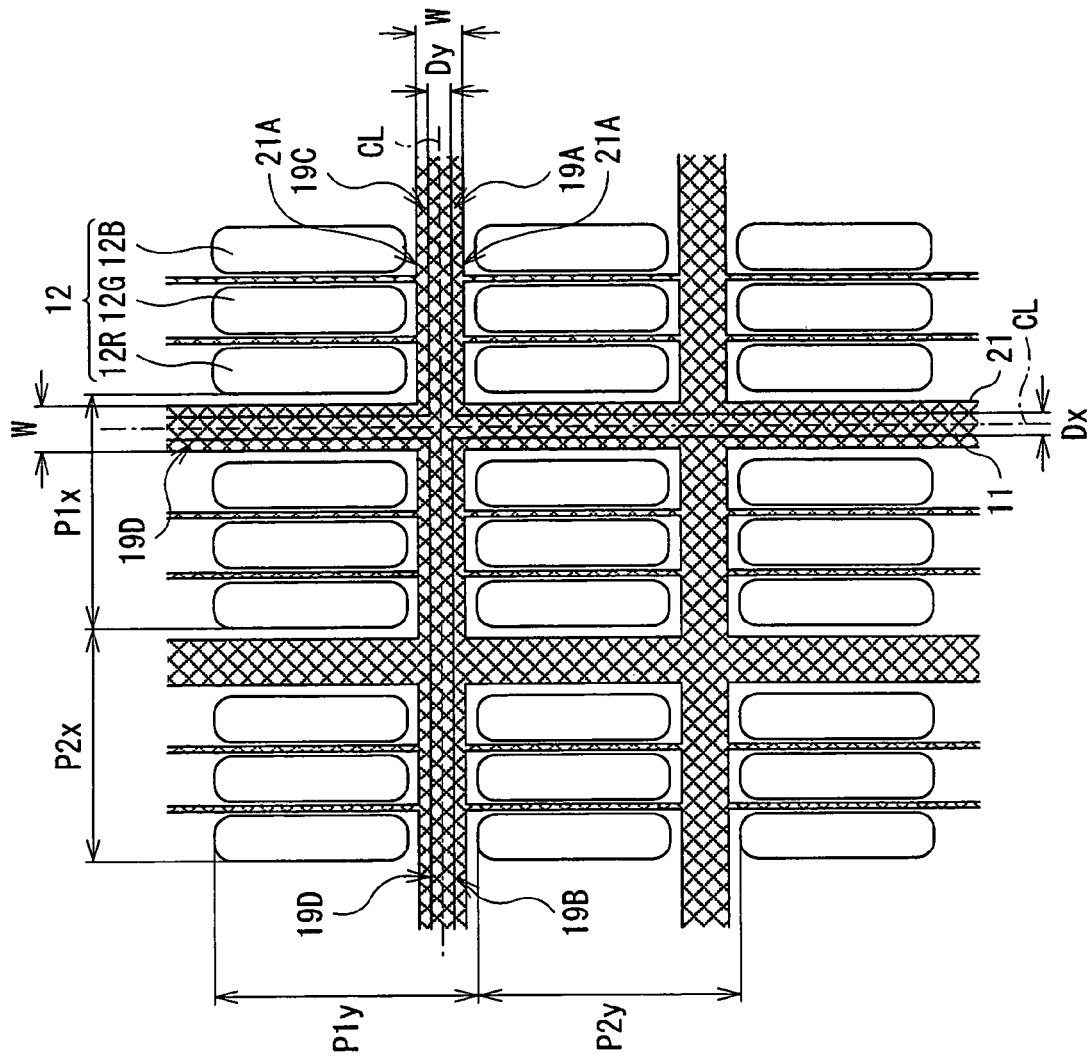
FIG. 17 is an enlarged view of an area around a seam portion shown in FIG. 16.

FIG. 17 shows an enlarged view of a portion of the display unit shown in FIG. 16 around the seam portion 11. In this case, the width Dx of the seam portion 11 is preferably set according to the size of the pixel 12 so that a pixel pitch P1x between the pixel 12 on the device substrate 10A or 10C and the pixel 12 on the device substrate 10B or 10D which are adjacent to each other with the seam portion 11 in between is equal to a normal pixel pitch P2x. Likewise, the width Dy of the seam portion 11 is preferably set according to the size of the pixel 12 so that a pixel pitch P1y between the pixel 12 on the device substrate 10A or 10B and the pixel 12 on the device substrate 10C or 10D which are adjacent to each other with the seam portion 11 in between is equal to a normal pixel pitch P2y. Moreover, end surfaces 19A, 19B, 19C and 19D of the device substrates 10A, 10B, 10C and 10D, respectively, are preferably positioned between the width direction central line CL and the width direction end portion 21A in the shielding film 21. Further, the widths Dx and Dy of the seam portion 11 are preferably equal to or smaller than the width W of the shielding film 21.

Figure 18:
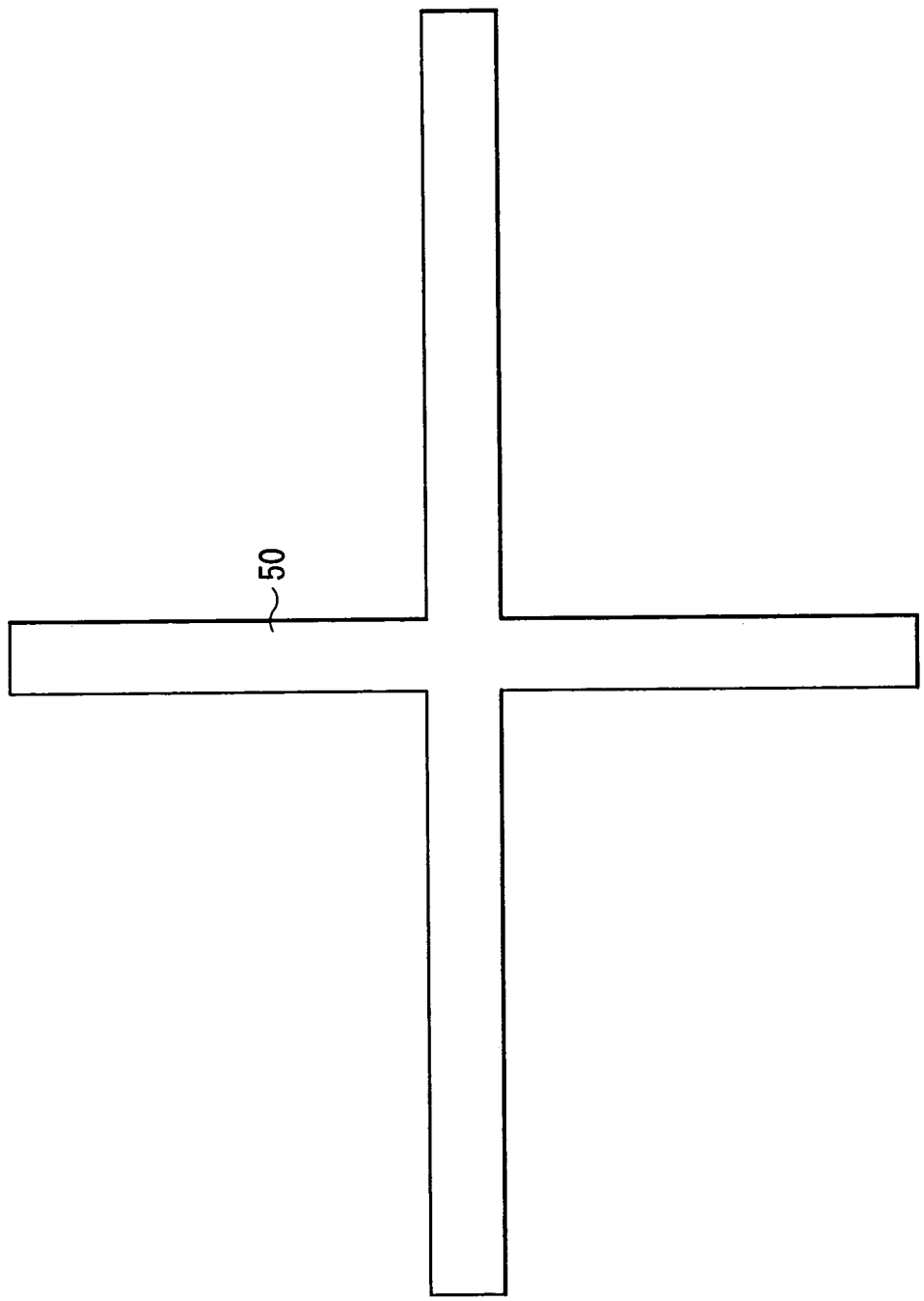
FIG. 18 is a plan view of a back sealing member used in the display unit shown in FIG. 16.

The display unit can be manufactured as in the case of the above embodiment. In the modification, the seam portion 11 has the shape of a cross, so, for example, the back sealing member 50 with the shape of a cross shown in FIG. 18 can be used, and the pressurizing plate 510 and the case 530 of the manufacturing apparatus 500 can have the shape of a cross in a like manner. In this case, a plurality of pushing members 520 are preferably disposed along the shape of the pressurizing plate 510, that is, the shape of a cross.

Although the present invention is described referring to the embodiment, the invention is not specifically limited to the embodiment and is variously modified. For example, in the embodiment, the alignment step, the temporary fixing step and the step of disposing the back sealing member are performed between the sealing step and the curing step; however, if precise alignment is possible in the sealing step, the alignment step may be removed. Moreover, the step of disposing the back sealing member is not necessarily performed, and as shown in FIG. 9, the adhesive resin for sealing 31 can be cured in a state where the adhesive resin for sealing 31 is extruded to the backside of the device substrates 10A and 10B and is not planarized.

Figure 19:
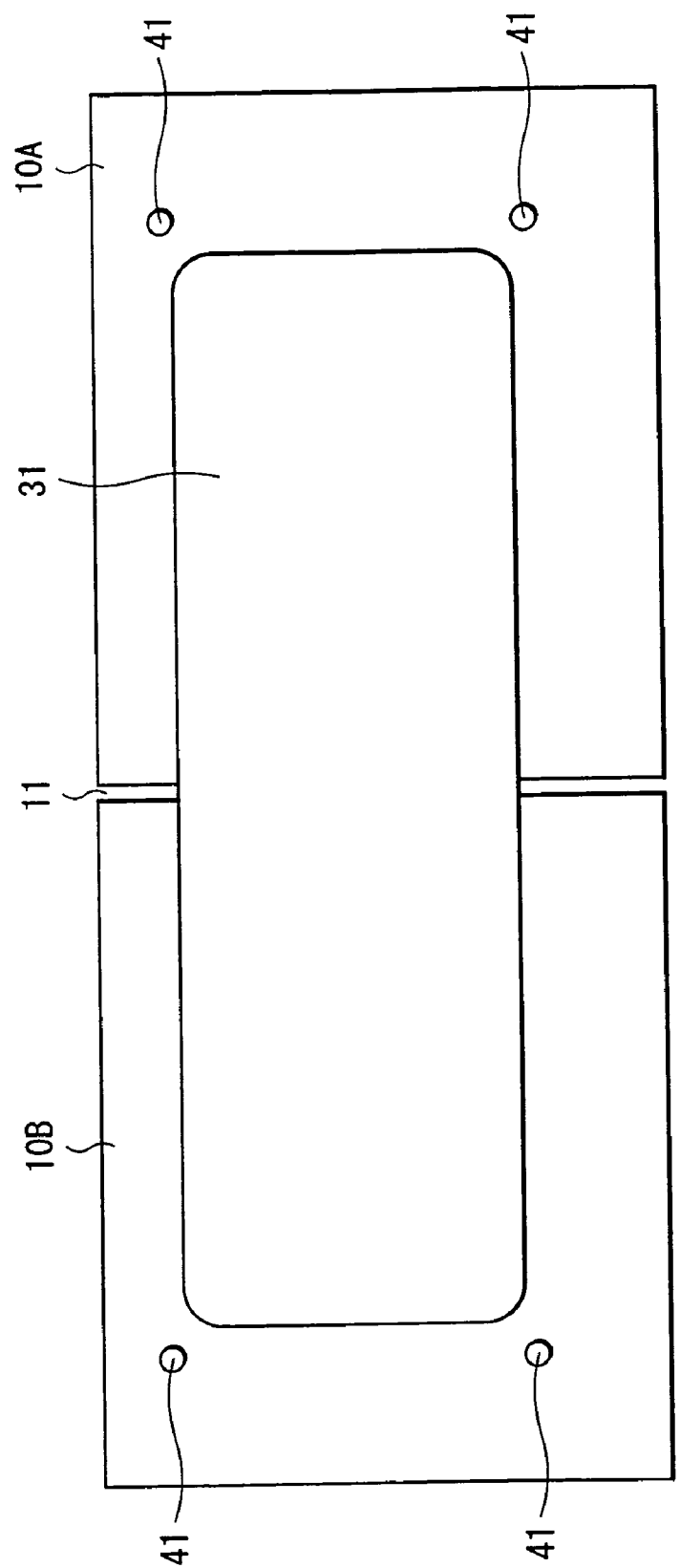
FIG. 19 is a plan view showing another state where an adhesive resin for sealing is applied according to an embodiment of the present invention.
Figure 20:
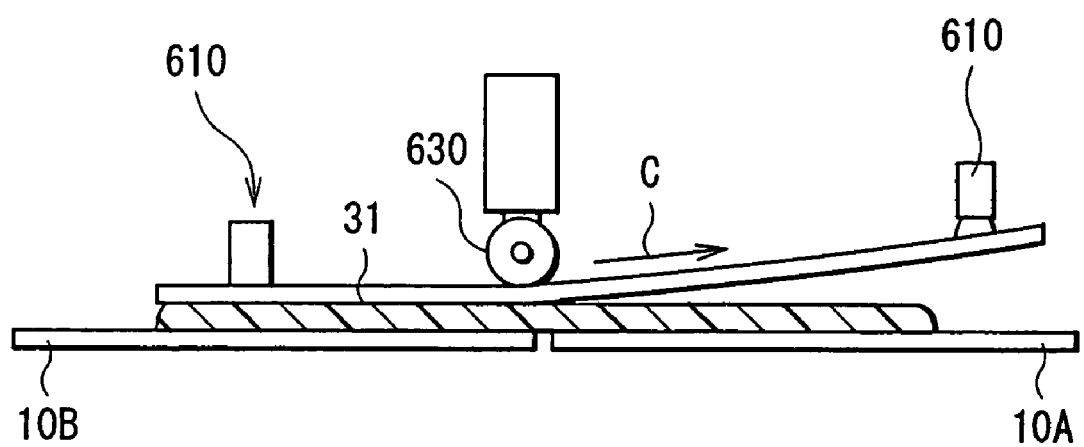
FIG. 20 is an illustration showing another example of a manufacturing apparatus used in a sealing step according to an embodiment of the present invention.

Moreover, for example, in the above embodiment, in the sealing step, the adhesive resin for sealing 31 is applied to the sealing substrate 20 in a sheet shape; however, as shown in FIG. 19, the adhesive resin for sealing 31 may be applied to the device substrates 10A and 10B in a sheet shape. In this case, as shown in FIG. 20, adsorption portions 610 and 620 support two facing sides of the sealing substrate 20, and a roller 630 moves on the sealing substrate 20 in a direction of an arrow C to press the sealing substrate 20 down, thereby a deflection angle of the sealing substrate 20 is reduced so that the sealing substrate 20 and the device substrates 10A and 10B can be bonded together.

Further, the materials and the thicknesses of the layers, film forming methods, film forming conditions and so on are not limited to those described in the embodiment, and any other materials, any other thicknesses, any other film forming methods and any other film forming conditions may be applicable.

In addition, in the embodiment, the structures of the organic light-emitting devices 12R, 12G and 12B are described in detail; however, each of them does not necessarily include all layers, and each of them may further include any other layer.

Further, the structure of each manufacturing apparatus described in the above embodiment is not specifically limited, and each manufacturing apparatus may have any other structure. For example, in the manufacturing apparatus 500 shown in FIG. 15, the pressurizing plate 510 and the pushing member 520 mounted in a unit which is a combination of the transfer portion 560 and the case 530 may be replaced with the transfer portion 213 shown in FIG. 10. Thereby, the step of bonding the device substrates 10A and 10B and the sealing substrate 20 together, the step of filling the seam portion 11 with the adhesive resin for sealing 31, and the step of disposing the back sealing member 50 on the backside of the seam portion 11 with the extruded adhesive resin for sealing 31 in between can be performed at the same time.

In addition, in the above embodiment and the above modification, the number of the device substrates is two and four; however, the number of the device substrates is not limited to two and four.

As described above, in the method of manufacturing the display unit according to the invention, while a plurality of device substrates are aligned on the same plane, and are bonded to the sealing substrate with the adhesive resin for sealing in between, the adhesive resin for sealing is extruded from the seam portion to the backside so as to fill the seam portion with the adhesive resin for sealing, so the backside of the seam portion can be securely sealed through a simple step. Therefore, the method is suitable for a large-scale display unit using the top-emitting organic light-emitting device which extracts light generated in the light-emitting layer from the second electrode.

Moreover, the light-emitting devices are formed on the device substrates before the device substrates are bonded to the sealing substrate, so unlike a conventional method, it is not required to upsize the manufacturing facilities corresponding to the large-scale substrate, and existing facilities for small-scale substrates can be used as is. Further, the areas of the device substrates are small, and the light-emitting devices can be uniformly formed, so variations in quality in the case where a plurality of device substrates are aligned so as to upsize the display unit can be reduced. Therefore, a large-scale display unit with high display quality can be achieved at low cost.

It should be understood that various changes and modifications to the presently preferred embodiments described herein will be apparent to those skilled in the art. Such changes and modifications can be made without departing from the spirit and scope of the present invention and without diminishing its intended advantages. It is therefore intended that such changes and modifications be covered by the appended claims.

The invention is claimed as follows:

1. A method of manufacturing a display unit, comprising:
   providing a plurality of device substrates each having a plurality of light-emitting devices thereon are aligned on a same plane;
   bonding together the device substrates and a sealing substrate with an adhesive resin for sealing in between, wherein the adhesive resin for sealing is extruded from a seam portion between the plurality of device substrates to a backside of the seam portion so as to fill the seam portion with the adhesive resin for sealing;
   curing the adhesive resin for sealing; and
   disposing a back sealing member on the backside of the seam portion with the extruded adhesive resin for sealing in between sealing and curing.

2. The method of manufacturing a display according to claim 1, wherein after the curing the adhesive resin, the back sealing member is removed.

3. The method of manufacturing a display unit according to claim 1, wherein
   the light-emitting device includes an organic light-emitting device comprising a first electrode, an organic layer including one or more layers which include a light-emitting layer, and a second electrode laminated in order on the device substrate, and extracting light generated in the light-emitting layer from the second electrode.

4. A method of manufacturing a display unit, comprising:
   providing a plurality of device substrates each having a plurality of light-emitting devices thereon are aligned on a same plane;
   bonding together the device substrates and a sealing substrate with an adhesive resin for sealing in between, wherein the adhesive resin for sealing is extruded from a seam portion between the plurality of device substrates to a backside of the seam portion so as to fill the seam portion with the adhesive resin for sealing;
   curing the adhesive resin for sealing;
   forming a shielding film on the sealing substrate before the sealing step; and
   aligning the sealing substrate and the plurality of device substrates so that the shielding film faces the seam portion between the plurality of device substrates between the sealing step and the curing step.

5. The method of manufacturing a display unit according to claim 4, further comprising:
   forming a device-side alignment mark on the plurality of device substrates before sealing,
   wherein in the step of forming a shielding film, a sealing-side alignment mark is formed on the sealing substrate, and
   in the alignment step, the sealing-side alignment mark and the device-side alignment mark are aligned so that the shielding film faces the seam portion between the plurality of device substrates.

6. The method of manufacturing a display unit according to claim 4, further comprising:
   temporarily fixing the plurality of device substrates and the sealing substrate by using an adhesive resin for temporary fixing between alignment and curing.

7. The method of manufacturing a display unit according to claim 6, wherein
   the plurality of device substrates are aligned with the sealing substrate one by one, and the device substrates which have been already aligned are temporarily fixed in order.

8. The method of manufacturing a display unit according to claim 4, wherein
   the light-emitting device includes an organic light-emitting device comprising a first electrode, an organic layer including one or more layers which include a light-emitting layer, and a second electrode laminated in order on the device substrate, and extracting light generated in the light-emitting layer from the second electrode.

* * * * *